(12) United States Patent
Lee

(10) Patent No.: US 10,177,192 B2
(45) Date of Patent: Jan. 8, 2019

(54) IMAGE SENSOR HAVING PHOTODIODES SHARING ONE COLOR FILTER AND ONE MICRO-LENS

(71) Applicant: SK hynix Inc., Gyeonggi-do (KR)

(72) Inventor: Won-Jun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 22 days.

(21) Appl. No.: 15/454,431

(22) Filed: Mar. 9, 2017

(65) Prior Publication Data
US 2018/0006077 A1    Jan. 4, 2018

(30) Foreign Application Priority Data

Jul. 4, 2016  (KR) ........................ 10-2016-0084070

(51) Int. Cl.
| | | |
|---|---|---|
| *H01L 27/146* | (2006.01) | |
| *H04N 5/378* | (2011.01) | |
| *H04N 9/04* | (2006.01) | |
| *H04N 5/369* | (2011.01) | |
| *H04N 5/3745* | (2011.01) | |

(52) U.S. Cl.
CPC .. H01L 27/14645 (2013.01); H01L 27/14605 (2013.01); H01L 27/14621 (2013.01); H01L 27/14627 (2013.01); H04N 5/3696 (2013.01); H04N 5/378 (2013.01); H04N 5/3745 (2013.01); H04N 9/045 (2013.01)

(58) Field of Classification Search
CPC combination set(s) only.
See application file for complete search history.

(56) References Cited

U.S. PATENT DOCUMENTS

| | | | |
|---|---|---|---|
| 9,661,306 B2* | 5/2017 | Hirota | H04N 5/35563 |
| 2010/0026865 A1* | 2/2010 | Tivarus | H01L 27/14647 |
| | | | 348/308 |
| 2010/0118172 A1* | 5/2010 | McCarten | H01L 27/14621 |
| | | | 348/302 |
| 2010/0148289 A1* | 6/2010 | McCarten | H01L 27/1463 |
| | | | 257/432 |
| 2012/0025060 A1* | 2/2012 | Iwata | H01L 27/14603 |
| | | | 250/208.1 |
| 2016/0006995 A1 | 1/2016 | Yun et al. | |
| 2016/0037152 A1 | 2/2016 | Kim et al. | |
| 2016/0054172 A1 | 2/2016 | Roh et al. | |
| 2016/0315112 A1* | 10/2016 | Park | H01L 27/14623 |
| 2017/0142325 A1* | 5/2017 | Shimokawa | G02B 7/28 |
| 2017/0163873 A1* | 6/2017 | Kim | H04N 5/3696 |
| 2017/0250212 A1* | 8/2017 | Kim | H01L 27/1461 |
| 2018/0090533 A1* | 3/2018 | Otake | H01L 27/14605 |
| 2018/0097036 A1* | 4/2018 | Otake | H01L 27/307 |

* cited by examiner

Primary Examiner — Mamadou Diallo
(74) Attorney, Agent, or Firm — IP & T Group LLP

(57) ABSTRACT

An image sensor is provides. The image sensor may include first and second photodiodes, a first color filter shared by the first and the second photodiodes, and first and second floating diffusion regions coupled to the first and the second photodiodes, respectively.

20 Claims, 29 Drawing Sheets

IMAGE SENSOR HAVING PHOTODIODES SHARING ONE COLOR FILTER AND ONE MICRO-LENS

CROSS-REFERENCE TO RELATED APPLICATIONS

The application claims priority to Korean Patent Application No. 10-2016-0084070, filed on Jul. 4, 2016, which is herein incorporated by reference in its entirety.

BACKGROUND

1. Field

Exemplary embodiments of the inventive concepts relate to an image sensor having a plurality of photodiodes sharing one color filter and one micro-lens.

2. Description of the Related Art

An image sensor is a device which converts an optical image into an electrical signal. Recently, with the development of the computer and communication industries, the demand for an image sensor having improved integration density and performance has increased in various devices such as a digital camera, a camcorder, a PCS (Personal Communication System), a game machine, a security camera, a medical micro-camera, and a robot. Recently, much attention has been given to technologies that detect a phase difference of light and perform auto-focusing.

SUMMARY

Exemplary embodiments of the inventive concepts provide an image sensor having a photodiode pair sharing one color filter and one micro-lens.

Exemplary embodiments of the inventive concepts provide an image sensor including photodiodes having a trapezoid or triangle shape.

Exemplary embodiments of the inventive concepts provide an image sensor including photodiodes having a shape formed by separating a rectangle into two parts along a diagonal direction.

Exemplary embodiments of the inventive concepts provide an image sensor in which two or more photodiodes share one color filter.

Exemplary embodiments of the inventive concepts provide an image sensor including photodiodes formed in a trapezoid or triangle shape having a bottom side and lateral sides which cross each other.

In accordance with an embodiment of the inventive concepts, an image sensor may includes a first floating diffusion region, and first, second, third, and fourth photodiodes, which in combination form a first unit pixel, a second floating diffusion region, and fifth, sixth, seventh, and eighth photodiodes, which in combination form a second unit pixel. The first, the second, the third, and the fourth photodiodes surround and share the first floating diffusion region. The fifth, the sixth, the seventh, and the eighth photodiodes surround and share the second floating diffusion region. The first, the third, the fifth, and the seventh photodiodes are arranged in a first direction. The first and the seventh photodiodes are located next to each other in the first direction. The second and the fourth photodiodes are arranged in a second direction which is perpendicular to the first direction. The sixth and the eighth photodiodes are arranged in a third direction which is perpendicular to the first direction and is parallel to the second direction. The first floating diffusion region and the second floating diffusion region are arranged in the first direction.

The image sensor may further include a first color filter overlapping and shared by the first and the seventh photodiodes, and a first micro-lens overlapping the first color filter.

The first color filter may have a first size. Each of the first through eighth photodiodes may have a second size. The second size may be a half of the first size.

The image sensor may further include first, second, third, and fourth transfer gates coupled between the first floating diffusion region and the first, the second, the third, and the fourth photodiodes, respectively, and fifth, sixth, seventh, and eighth transfer gates coupled between the second floating diffusion region and the fifth, the sixth, the seventh, and the eighth photodiodes, respectively.

The image sensor may further include a first color filter overlapping the first, the second, the third, and the fourth photodiodes, and a second color filter overlapping the overlapping the fifth, the sixth, the seventh, and the eighth photodiodes.

The image sensor may further include a first micro-lens overlapping the first color filter, and a second micro-lens overlapping the second color filter.

In accordance with an embodiment of the inventive concepts, an image sensor may include first to eighth photodiodes, a color filter overlapping and shared by two or more of the first to eighth photodiodes, and a micro-lens overlapping the color filter.

The first and the fifth photodiodes may be located next to each other. The first and the fifth photodiodes may be symmetrical in shape to each other. The first and the fifth photodiodes, in combination, may form a rectangular shape. The second and the sixth photodiodes may be located next to each other. The second and the sixth photodiodes may be symmetrical in shape to each other. The second and the sixth photodiodes, in combination, may form a rectangular shape. The third and the seventh photodiodes may be located next to each other. The third and the seventh photodiodes may be symmetrical in shape to each other. The third and the seventh photodiodes, in combination, may form a rectangular shape. The fourth and the eighth photodiodes may be located next to each other. The fourth and the eighth photodiodes may be symmetrical in shape to each other. The fourth and the eighth photodiodes, in combination, may form a rectangular shape.

Each of the first to eighth photodiodes may be formed in a trapezoid or a triangle shape.

The color filter may include first, second, third, and fourth color filters. The first color filter may overlap and be shared by the first and the fifth photodiodes. The second color filter may overlap and be shared by the second and the sixth photodiodes. The third color filter may overlap and be shared by the third and the seventh photodiodes. The fourth color filter may overlap and be shared by the fourth and the eighth photodiodes.

The micro-lens may include first, second, third, and fourth micro-lenses. The first micro-lens may overlap the first color filter. The second micro-lens may overlap the second color filter. The third micro-lens may overlap the third color filter. The fourth micro-lens may overlap the fourth color filter.

The image sensor may further include a first floating region. The first, the second, the third and the fourth photodiodes may be arranged to surround the first floating region. The first, the second, the third, and the fourth color filters may be arranged to surround the first floating region.

The first, the second, the third, and the fourth micro-lenses may be arranged to surround the first floating region.

The image sensor may further include a first transfer gate coupled between the first floating region and the first photodiode, a second transfer gate coupled between the first floating region and the second photodiode, a third transfer gate coupled between the first floating region and the third photodiode, and a fourth transfer gate coupled between the first floating region and the fourth photodiode. The first floating region, the first, the second, the third, and the fourth photodiodes, and the first the second, the third, and the fourth transfer gates, in combination, may form a unit pixel.

The color filter may include first, second, third, fourth, and fifth color filters. The first color filter may overlap and be shared by the first, the second, the third, and the fourth photodiodes. The second color filter may overlap the fifth photodiode. The third color filter may overlap the sixth photodiode. The fourth color filter may overlap the seventh photodiode. The fifth color filter may overlap the eighth photodiode.

The micro-lens may include first, fifth, sixth, seventh, and eighth micro-lenses. The first micro-lens may overlap the first color filter. The fifth micro-lens may overlap the fifth color filter. The sixth micro-lens may overlap the sixth color filter. The seventh micro-lens may overlap the seventh color filter. The eighth micro-lens may overlap the eighth color filter.

The image sensor may further include a first floating diffusion region coupled to the first photodiode and further coupled to one or more of the second, the third, and the fourth photodiodes and a second floating diffusion region coupled to the fifth photodiode.

In accordance with an embodiment of the inventive concepts, an image sensor may include first and second photodiodes, a first color filter shared by the first and the second photodiodes, and first and second floating diffusion regions coupled to the first and the second photodiodes, respectively.

The image sensor may further include third, fourth, and fifth photodiodes. The first, the third, the fourth, and the fifth photodiodes may surround and be coupled to the first floating diffusion region. The first, the third, the fourth, and the fifth photodiodes and the first floating diffusion region, in combination, may form a first unit pixel.

The image sensor may further include sixth, seventh, and eighth photodiodes, sixth, seventh, and eighth floating diffusion regions coupled to the sixth, the seventh, and the eighth photodiodes, respectively, a second color filter shared by the third and the sixth photodiodes, a third color filter shared by the fourth and the seventh photodiodes, and a fourth color filter shared by the fifth and the eighth photodiodes. A half of the first co or filter, a half of the second color filter, a half of the third color filter, a half of the fourth color filter, and the first floating diffusion region, in combination, may form the first unit pixel.

The image sensor may further include a first transfer gate coupled between the first photodiode and the first floating diffusion region, and a fifth transfer gate coupled between the fifth photodiode and the fifth floating diffusion region.

The details of other embodiments are included in the detailed description and the drawings.

DETAILED DESCRIPTION

Figure 1:
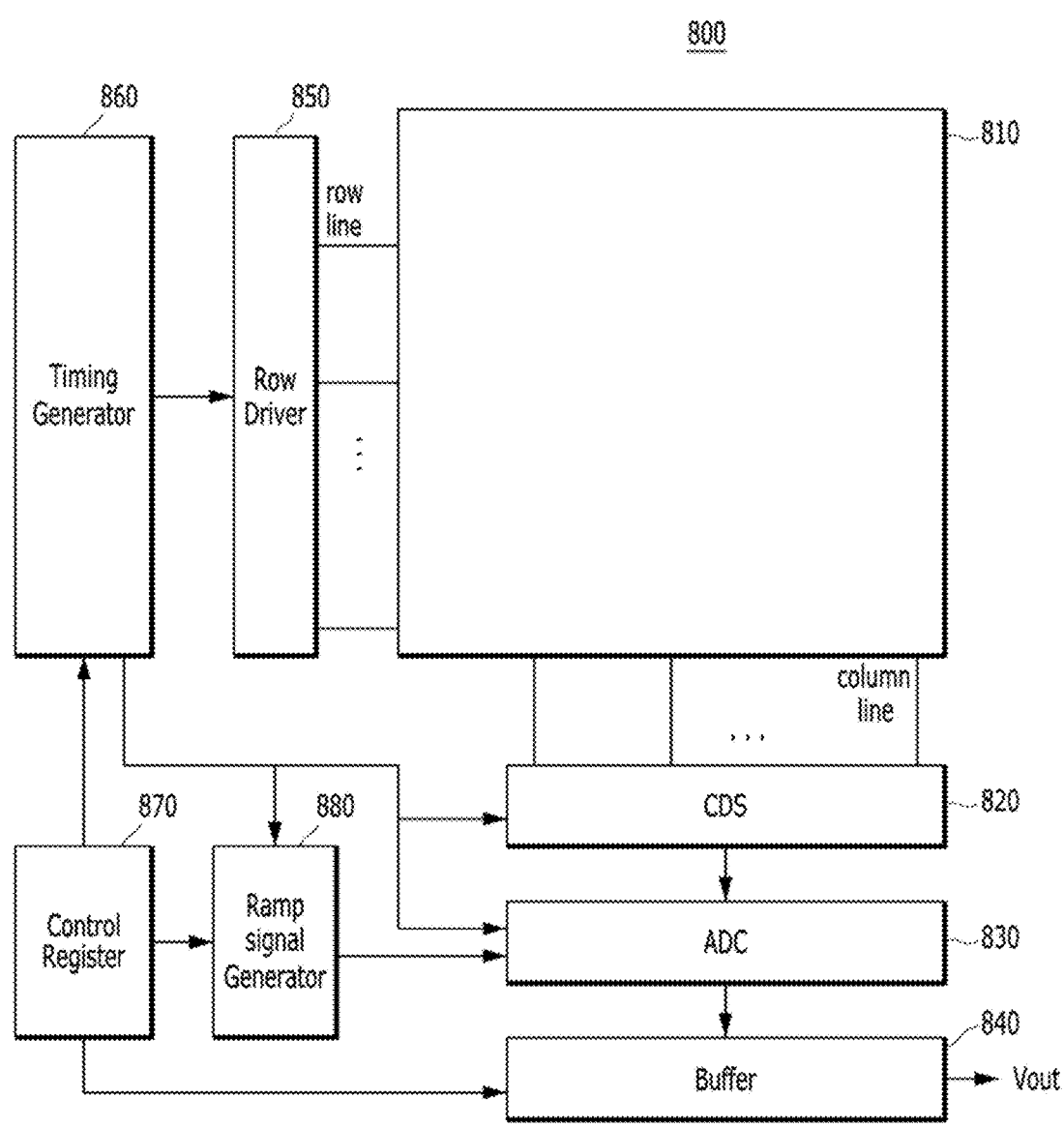
FIG. 1 is a block diagram schematically illustrating an image sensor in accordance with an embodiment.

Various embodiments will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. Throughout the disclosure, like reference numerals refer to like parts throughout the various figures and embodiments of the inventive concepts.

Throughout the disclosure, a unit pixel may include one floating diffusion region and photodiodes sharing the floating diffusion region.

FIG. 1 is a block diagram schematically illustrating an image sensor 800 in accordance with an embodiment. Referring to FIG. 1, the image sensor may include a pixel array 810, a Correlated Double Sampler (CDS) 820, an Analog-Digital Converter (ADC) 830, a buffer 840, a row driver 850, a timing generator 860, a control register 870, and a ramp signal generator 880. The pixel array 810 may include a plurality of unit pixels 110 arranged in a matrix shape.

The pixel array 810 may include a plurality of pixels arranged in a matrix shape. Each of the pixels may convert optical image information into an electrical image signal, and transmit the electrical image signal to the CDS 820 through column line. A plurality of pixels may be coupled to one row line of row lines and one column line of the column lines.

The CDS 820 may sample electrical image signals received from pixels of the pixel array 810. For example, the CDS 820 may sample a reference voltage level and the voltage levels of the received electrical image signals according to a clock signal provided from the timing generator 860, and transmit analog signals corresponding to differences therebetween to the ADC 830. The ADC 830 may convert the received analog signals into digital signals, and transmit the digital signals to the buffer 840.

The buffer 840 may latch the received digital signals, and sequentially output the latched signals to an image signal processor (not illustrated). The buffer 840 may include a memory for latching a digital signal and a sense amplifier for amplifying a digital signal.

The row driver 850 may drive the plurality of pixels of the pixel array 810 according to a signal of the timing generator 860. For example, the row driver 850 may generate driving signals for selecting and driving one row line among the plurality of row lines. The timing generator 860 may generate a timing signal for controlling the CDS 820, the ADC 830, the row driver 850, and the ramp signal generator 880.

The control register 870 may generate control signals for controlling the buffer 840, the timing generator 860, and the ramp signal generator 880. The ramp signal generator 880 may generate a ramp signal for controlling an image signal outputted from the buffer 840 according to control of the timing generator 860.

Figure 2A:
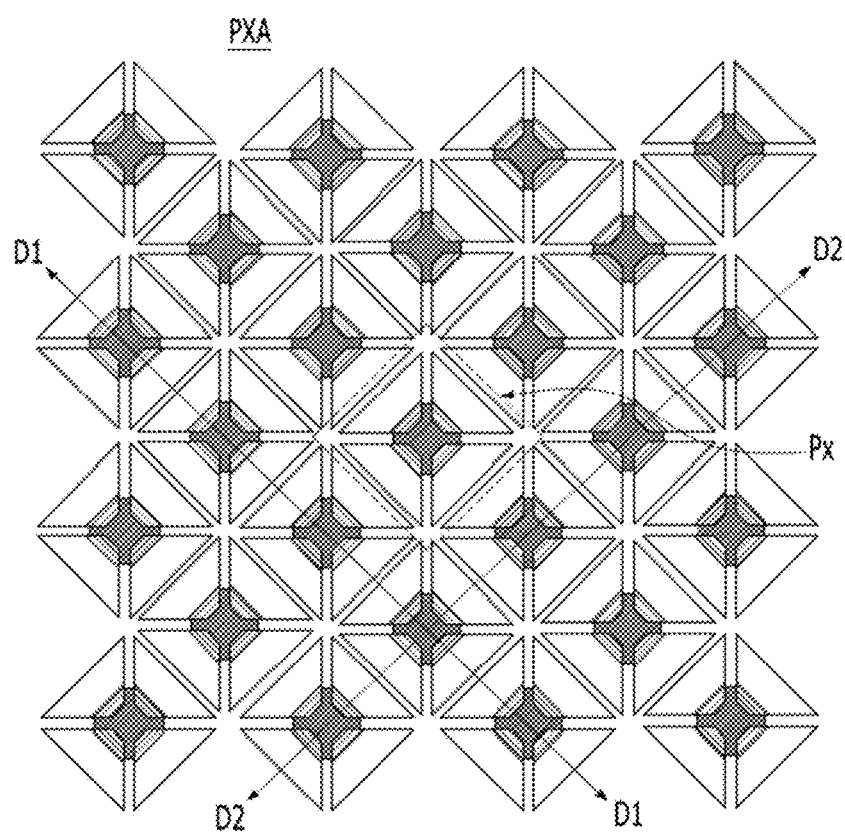
FIG. 2A is a layout diagram schematically illustrating a pixel array of an image sensor in accordance with an embodiment.
Figure 2B:
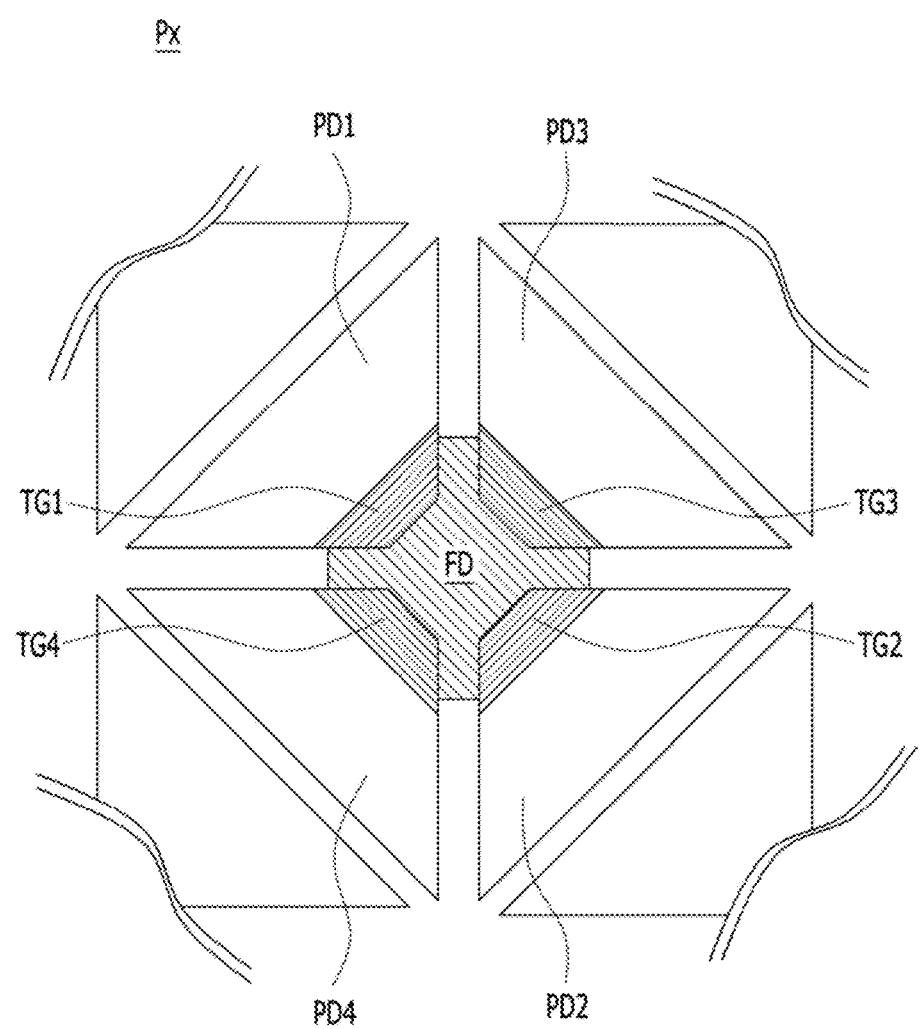
FIG. 2B is an enlarged view of a unit pixel shown in FIG. 2A.

FIG. 2A is a layout diagram schematically illustrating a pixel array PXA of an image sensor in accordance with an embodiment, and FIG. 2B is an enlarged view of a unit pixel Px of FIG. 2A. Referring to FIGS. 2A and 2B, a pixel array PXA of an image sensor in accordance with an embodiment of the inventive concepts may include a plurality of diamond-shaped unit pixels Px which are two-dimensionally arranged. For example, square-shaped unit pixels Px tilted at 45 degrees may be repetitively arranged in such a manner that the respective sides of the unit pixels are adjacent to each other along two diagonal directions D1 and D2 which are perpendicular to each other.

Referring to FIG. 2B, one unit pixel Px may include first to fourth photodiodes PD1 to PD4 and first to fourth transfer gates TG1 to TG4, which are two-dimensionally arranged at the left top, right bottom, right top, and left bottom of one floating diffusion region FD disposed in the center, respectively. The floating diffusion region FD may have a polygon shape such as square or a circular shape.

The first to fourth photodiodes PD1 to PD4 and the first to fourth transfer gates TG1 to TG4 may have an isosceles trapezoid shape or a right-angled triangle shape or isosceles triangle shape. For example, each of the first to fourth photodiodes PD1 to PD4 may have a bottom side extending along one of the two diagonal directions D1 and D2 perpendicular to each other and two lateral sides extending along the vertical or horizontal direction. The photodiode may be disposed in such a manner that the short side of the isosceles trapezoid or the vertex of the triangle faces the floating diffusion region FD. The first to fourth transfer gates TG1 to TG4 may overlap parts of the photodiodes PD1 to PD4 and parts of the floating diffusion region FD, respectively. Thus, the transfer gates TG1 to TG4 may transmit charges generated through the photodiodes PD1 to PD4 to the floating diffusion region FD.

Figure 2C:
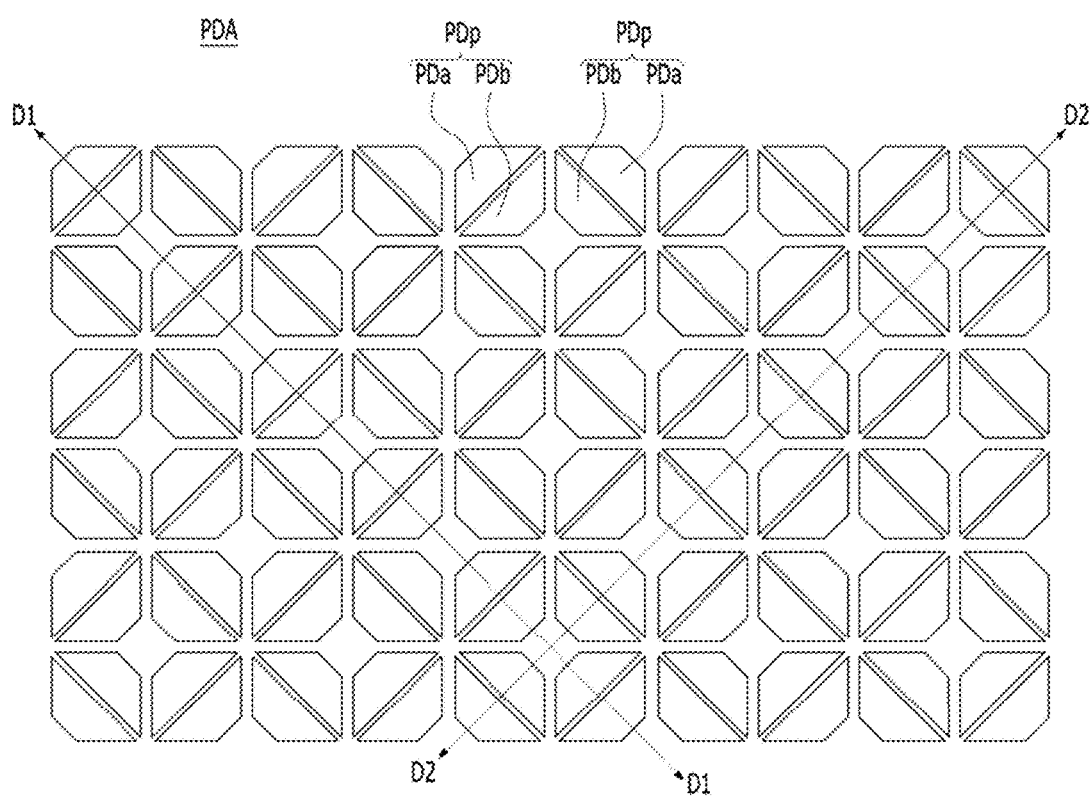
FIG. 2C is a layout diagram schematically illustrating a photodiode array of an image sensor in accordance with an embodiment.

FIG. 2C is a layout diagram schematically illustrating photodiode array PDA of the image sensor in accordance with the embodiment. Referring to FIG. 2C, the photodiode array PDA of the image sensor in accordance with the embodiment may include a plurality of unit photodiode pairs PDp which are repetitively arranged along the two diagonal directions D1 and D2 perpendicular to each other. Each of the unit photodiode pairs PDp may include first and second photodiodes PDa and PDb which are formed in an isosceles trapezoid shape such that the bottom sides thereof are opposite to each other.

Each of the first and second photodiodes PDa and PDb may have a shape formed by separating one rectangle into two parts along the first or second diagonal direction D1 or D2. One unit photodiode pair PDp or the first and second photodiodes PDa and PDb forming a pair may have an approximate square shape or a square shape. One unit photodiode pair PDp may be included in different unit pixels Px adjacent to each other.

Figure 2D:
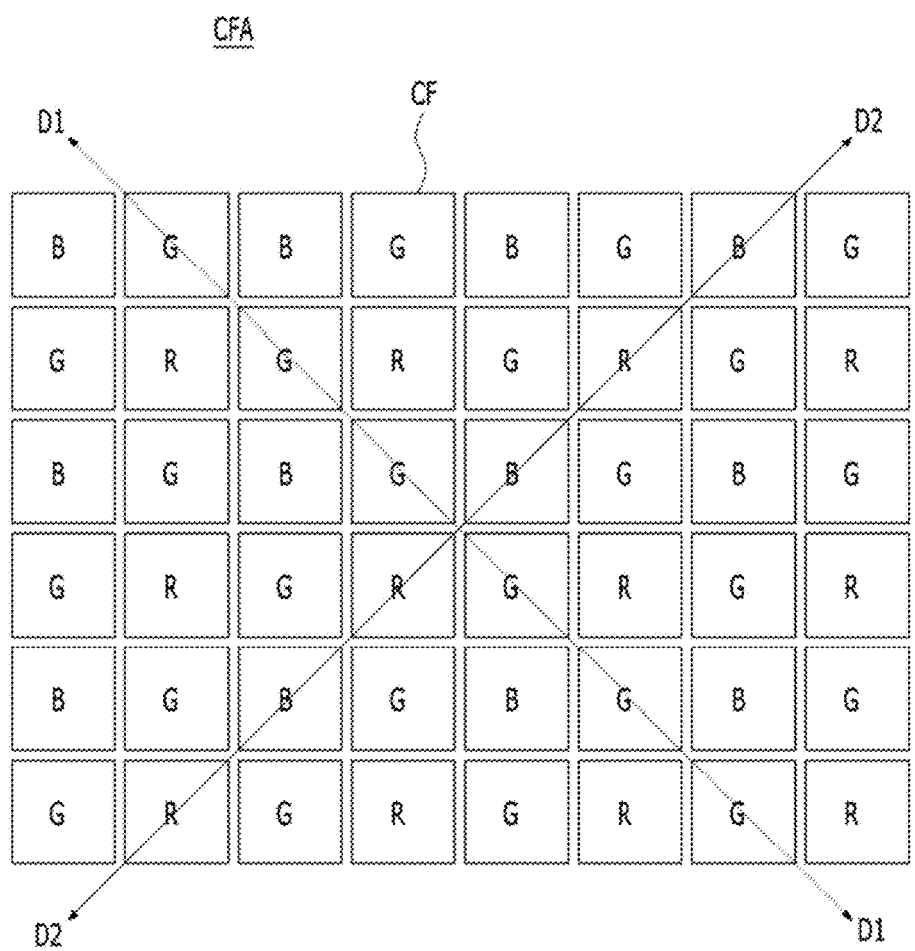
FIG. 2D is a layout diagram schematically illustrating a color filter array of an image sensor in accordance with an embodiment.

FIG. 2D is a layout diagram schematically illustrating a color filter array CFA of the image sensor in accordance with the embodiment. Referring to FIG. 2D, the color filter array CFA of the image sensor in accordance with the embodiment may include rectangular color filters CF arranged in an island grid or checker board shape. The color filter array CFA may include, for example, green filters G blue filters B, and red filters R. The green filters G may be successively arranged along the two diagonal directions D1 and D2. The green filters G may be alternately arranged in the vertical or horizontal direction. The blue filters B and the red filters R may be alternately arranged along the two diagonal directions D1 and D2. The blue filters B and the red filters R may be alternately arranged in the vertical or horizontal direction.

That is, the green filter G and any one selected between the blue filter B and the red filter R may be alternately arranged in the same row or column.

Figure 2E:
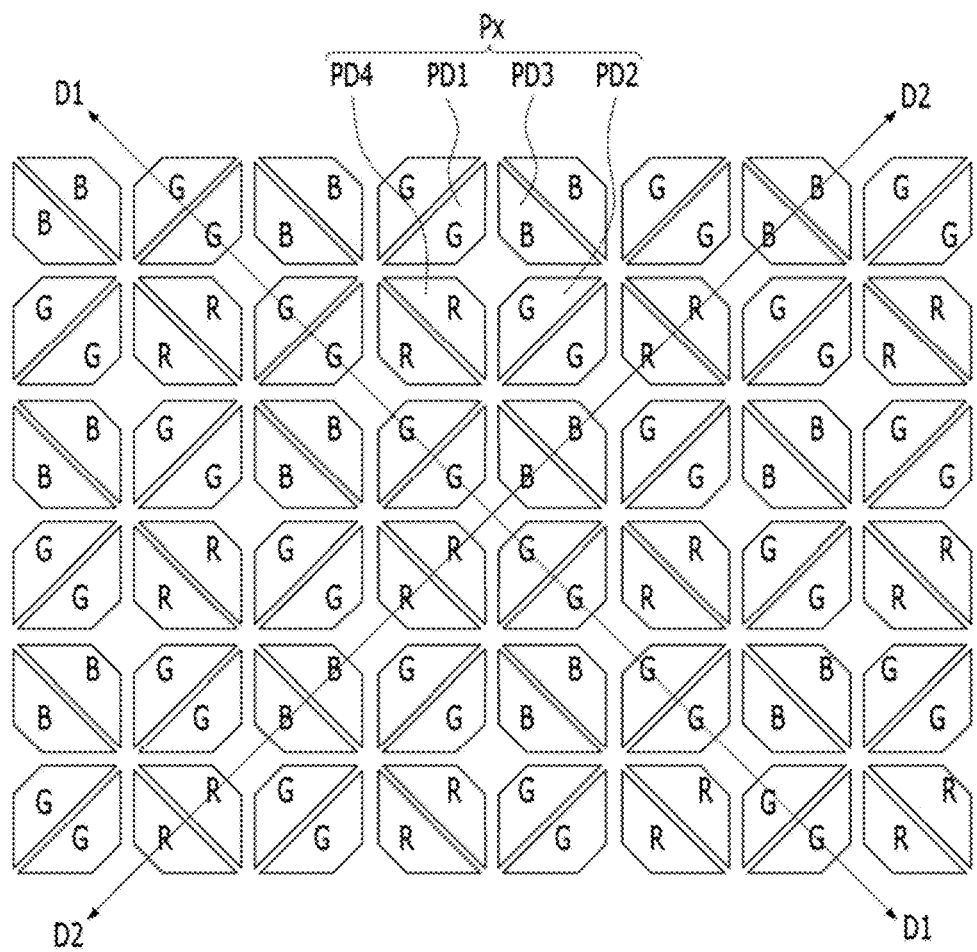
FIG. 2E is a diagram illustrating the colors of photodiodes of the photodiode array of an image sensor in accordance with an embodiment.

FIG. 2E is a diagram illustrating the colors G, B, and R of the photodiodes of the photodiode array PDA of the image sensor in accordance with the embodiment. Specifically, FIG. 2E illustrates the colors of the photodiodes PD, which are obtained by overlapping the color filter array CFA and the photodiode array PDA. Referring to FIG. 2E, first and second photodiodes PD may have the same color according to the color filter array CFA overlapping the first and second photodiodes PD. Referring to FIGS. 2C and 2D, the first and second photodiodes PDa and PDb of which the bottom sides are opposite to each other may overlap the same color filter CF. That is, the first and second unit photodiodes PDa and PDb may share one color filter CF.

Figure 2F:
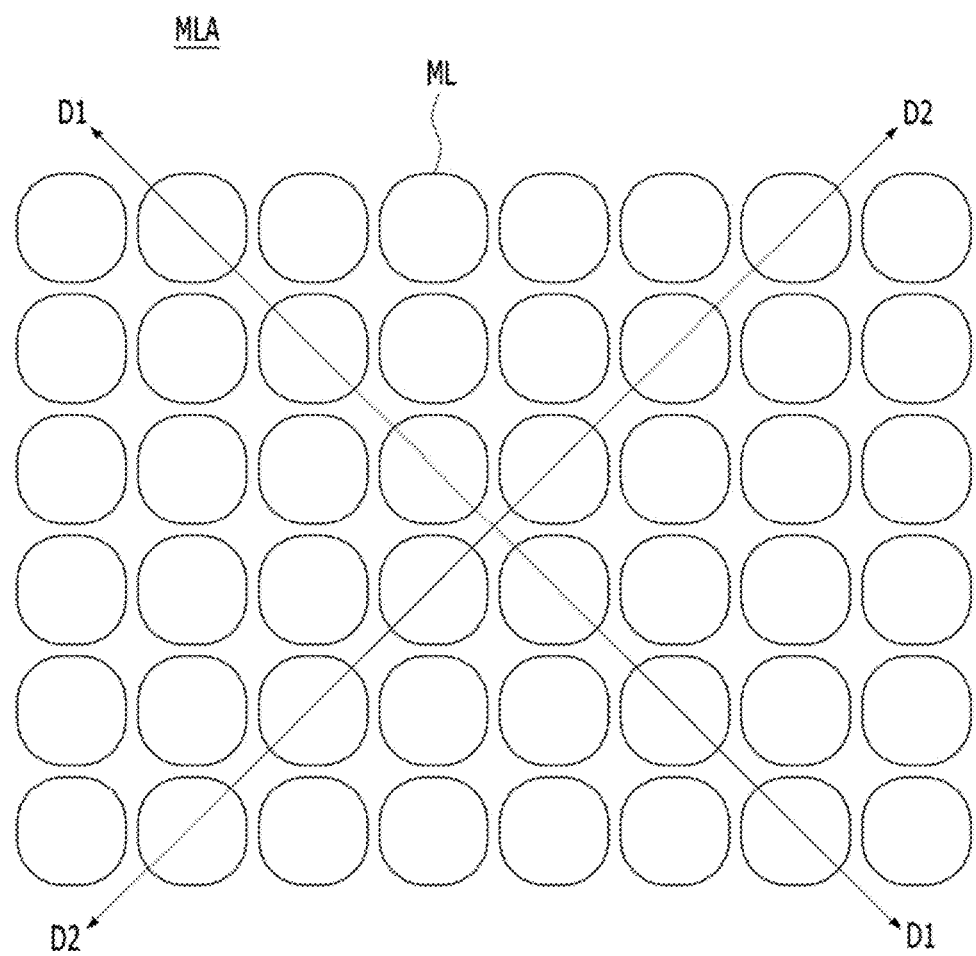
FIG. 2F is a layout diagram schematically illustrating a micro-lens array of an image sensor in accordance with an embodiment.

FIG. 2F is a layout diagram schematically illustrating a micro-lens array MLA of the image sensor in accordance with the embodiment Referring to FIG. 2F, the micro-lens array MLA of the image sensor in accordance with the embodiment may have the same two-dimensional arrangement as the color filter array CFA described with reference to FIG. 2D. That is, one micro-lens ML may overlap one color filter CF. Thus, referring to FIG. 2E, the two photodiodes PDa and PDb may overlap and share one micro-lens M.

Figure 2G:
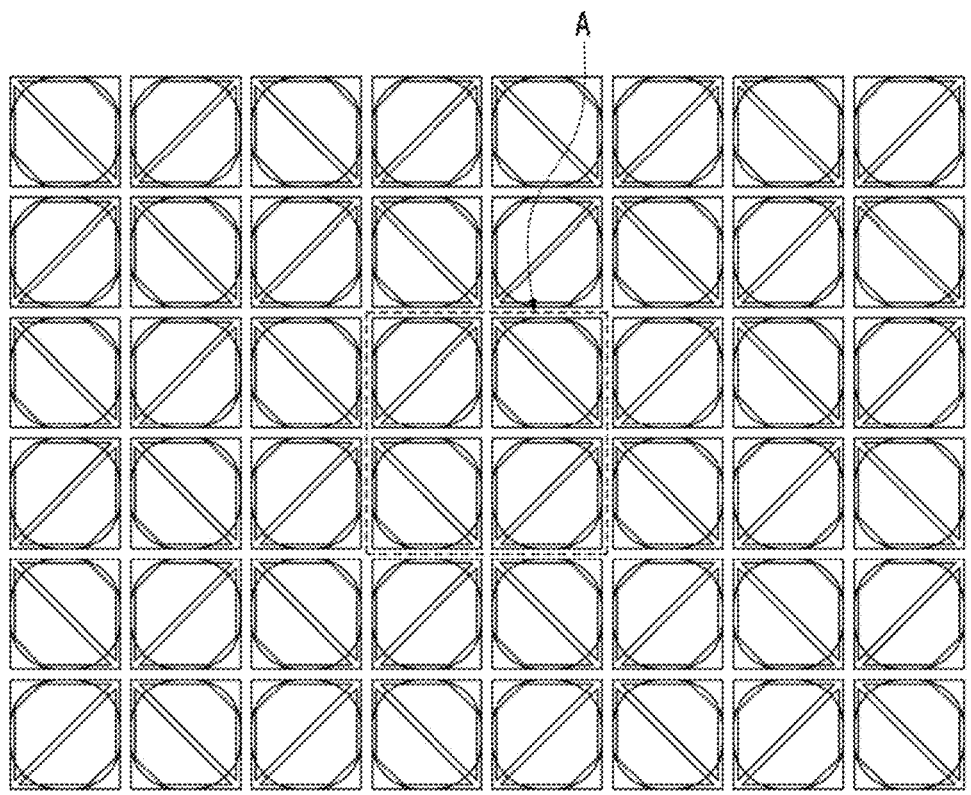
FIG. 2G is a layout diagram obtained by overlapping the photodiode array PDA, the color filter array CFA, and the micro-lens array MLA of an image sensor in accordance with an embodiment.
Figure 2H:
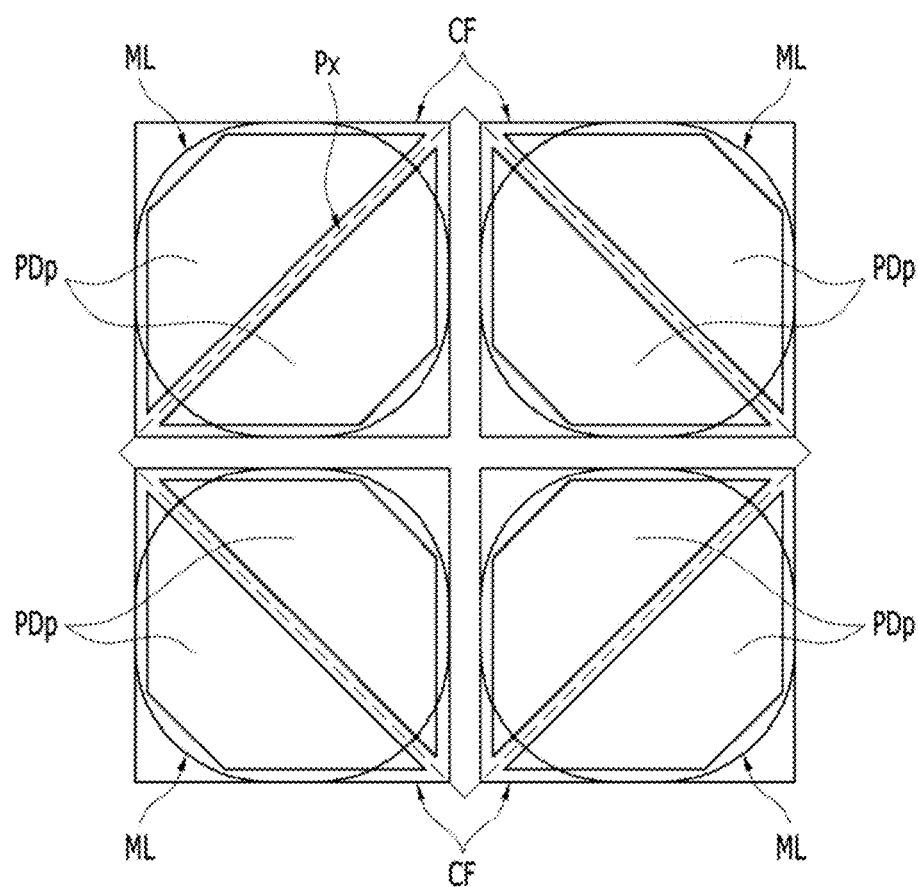
FIG. 2H is an enlarged layout diagram of one unit pixel of FIG. 2G.

FIG. 2G is a layout diagram obtained by overlapping the photodiode array PDA, the color filter array CFA, and the micro-lens array MLA of the image sensor in accordance with the inventive concepts, and FIG. 2H is an enlarged layout diagram of an area A in FIG. 2G, the area A including one unit pixel PX. As described above, the color filters CF of the color filter array CFA may accurately overlap the micro-lenses ML of the micro-lens array MLA. One photodiode pair PDp, one color filter CF, and one micro-lens ML may overlap one another. That is, two photodiodes PD may overlap one color filter CF and one micro-lens ML. Each of the photodiodes PD may have a shape formed by separating a rectangle into two parts along the first or second direction D1 or D2.

Therefore, one unit pixel Px may include one photodiode of each of four photodiode pairs PDp, ½ area of each of the four color filters CF, and ½ area of each of the four micro-lenses ML. Referring to FIG. 2B, the floating diffusion region FD may be arranged in the center of the four photodiode pairs PDp, the four color filters CF, and the four micro-lenses ML. Thus, the photodiodes closer to the floating diffusion region FD in the four photodiode pairs PDp which are radially arranged around one floating diffusion region FD, the ½ areas closer to the floating diffusion region FD in the four color filters CF, and the ½ areas closer to the floating diffusion region FD in the four micro-lenses ML may form one unit pixel Px.

Figure 3A:
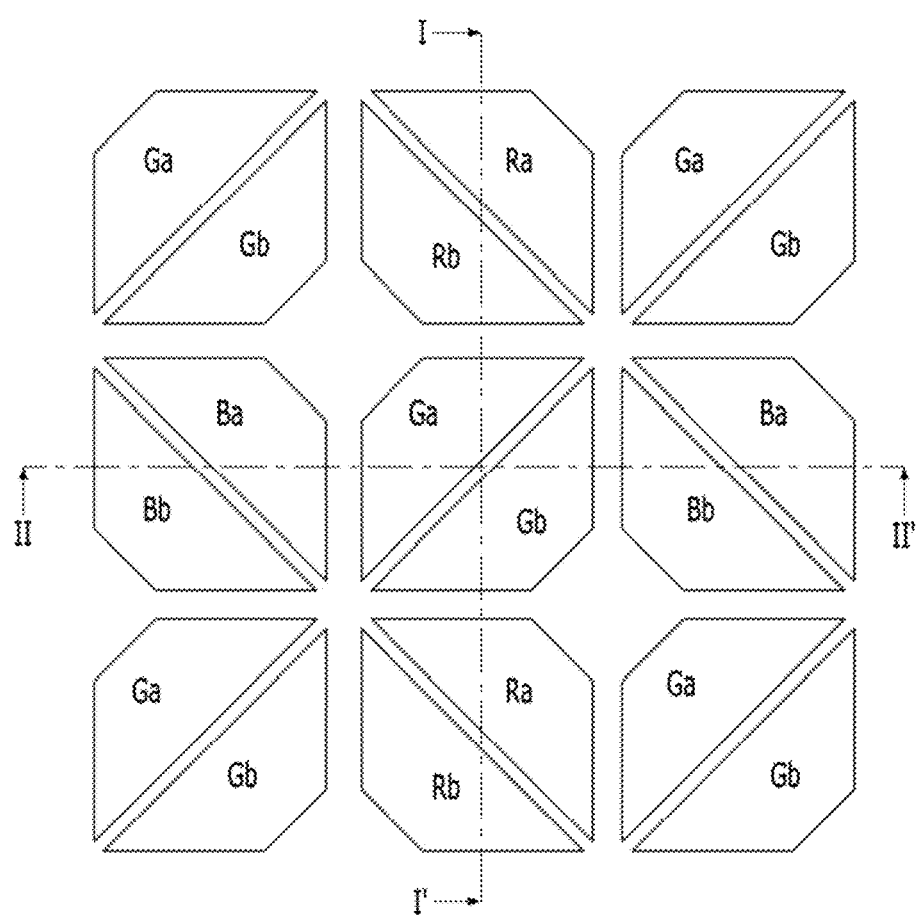
FIG. 3A is an enlarged view of the photodiode array PDA of an image sensor in accordance with an embodiment.
Figure 3B:
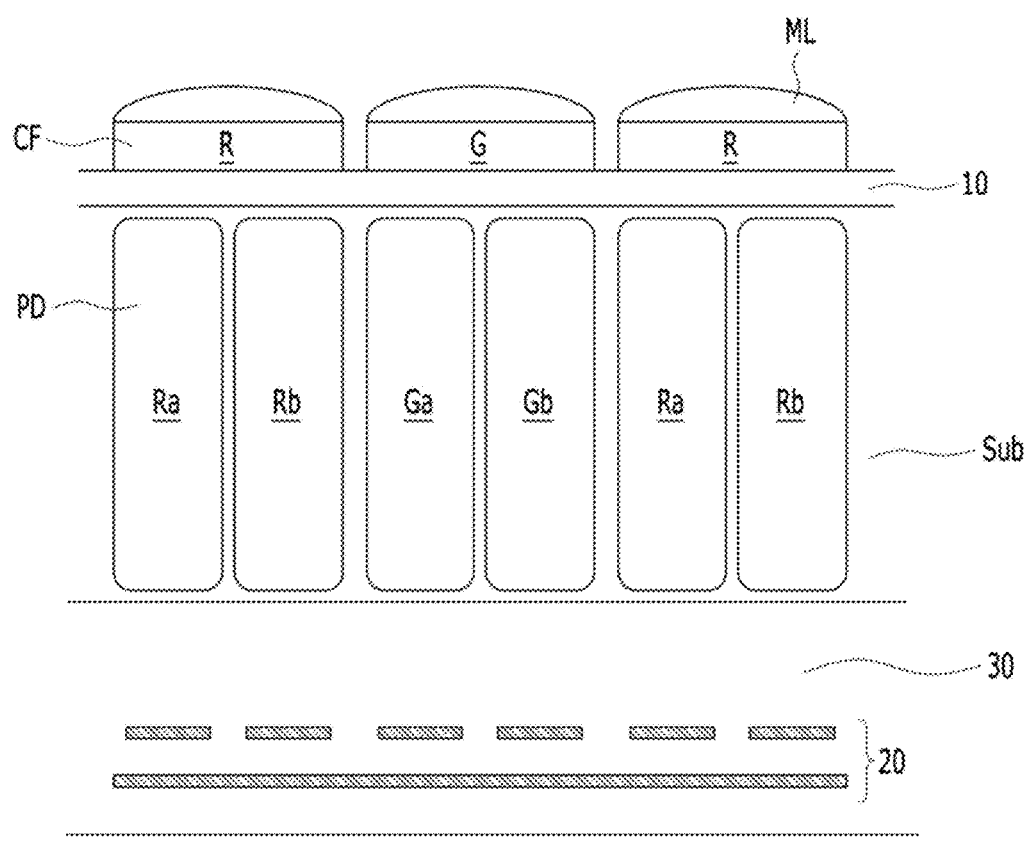
FIGS. 3B and 3C are conceptual cross-sectional views taken along the lines I-I' and II-II' shown in FIG. 3A, respectively.
Figure 3C:
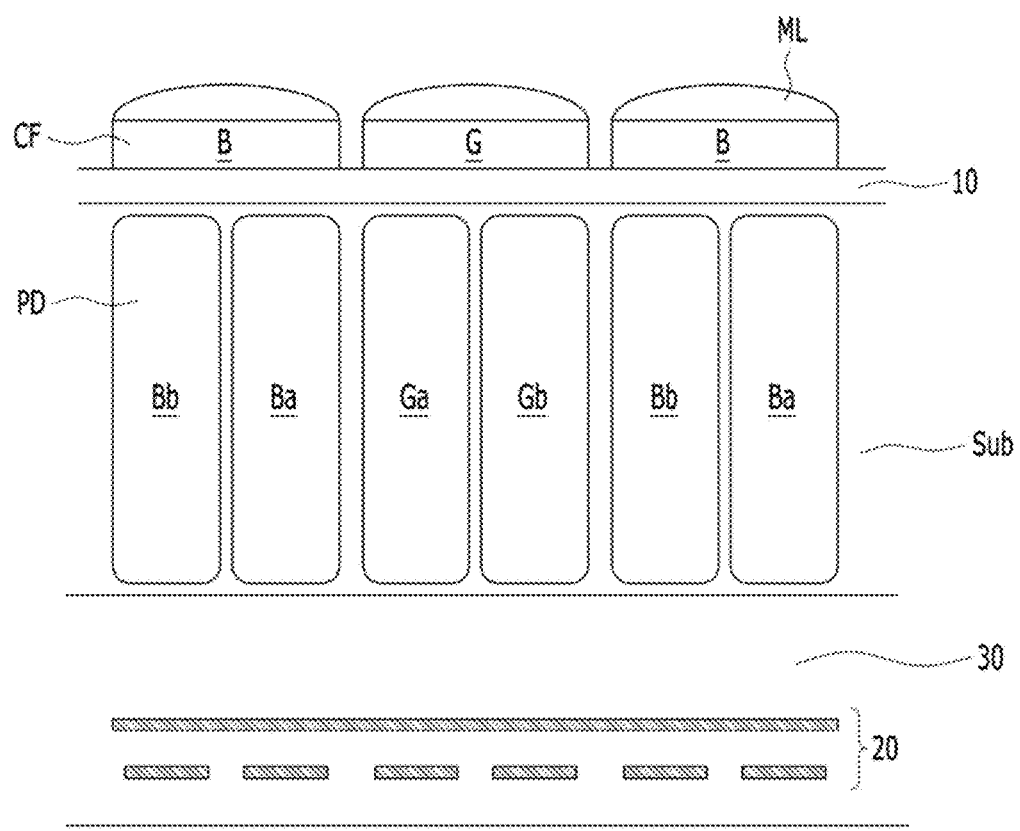

FIG. 3A is an enlarged view of the photodiode array PDA of the image sensor in accordance with the embodiment, and FIGS. 3B and 3C are conceptual cross-sectional views taken along the lines I-I' and II-II' shown in FIG. 3A. Referring to FIGS. 3A to 3C, the image sensor in accordance with the embodiment may include a plurality of photodiodes PD_Ga, PD_Gb, PD_Ra, PD_Rb, PD_Ba, and PD_Bb, a planarized layer 10, color filters CF, micro-lenses ML, a metal line layer 20 and an interlayer dielectric layer 30. The plurality of photodiodes PD_Ga, PD_Gb, PD_Ra, PD_Rb, PD_Ba, and PD_Bb may be formed in a substrate Sub. The planarized layer 10, the color filters CF, and the micro-lenses ML may be formed on the top surface of the substrate Sub. The metal line layer 20 and the interlayer dielectric layer 30 may be formed on the bottom surface of the substrate Sub. The planarized layer 10 and the interlayer dielectric layer 30 may include silicon oxide, silicon nitride, or a combination thereof.

Among the plurality of photodiodes PD_Ga, PD_Gb, PD_Ra, PD_Rb, PD_Ba, and PD_Bb, two photodiodes having the same color may share one color filter CF having the same color among the color filters CF. Specifically, the first and second green photodiodes PD_Ga and PD_Gb may share one green color filter CF_G, the first and second red photodiodes PD_Ra and PD_Rb may share one red color filter CF_R, and the first and second blue photodiodes PD_Ba and PD_Bb may share one blue color filter CF_B. Since the photodiodes PD_Ga PD_Gb, PD_Ra, PD_Rb, PD_Ba, and PD_Bb are optically and electrically separated from each other, each of the photodiodes can independently operate.

All of the unit pixels Px of the image sensor in accordance with the embodiment may be used as phase difference detection pixels. A conventional phase difference detection pixel may shade a part of light incident on one microlens, one color filter, and one photodiode, and detect a phase difference of the light. However, since each of the photodiodes of the unit pixels Px of the image sensor in accordance with the embodiment is divided into two parts, the unit pixels Px can detect a phase difference of incident light without shading a part of the light.

In a conventional image sensor, a phase difference detection pixel includes a mask pattern which shades light. Thus the phase difference detection pixel may not normally detect an optical image, and be recognized as a defect point. However, since the image sensor in accordance with the embodiment does not shade incident light all of the unit pixels Px can detect a phase difference of light, and normally detect an optical image.

Figure 4A:
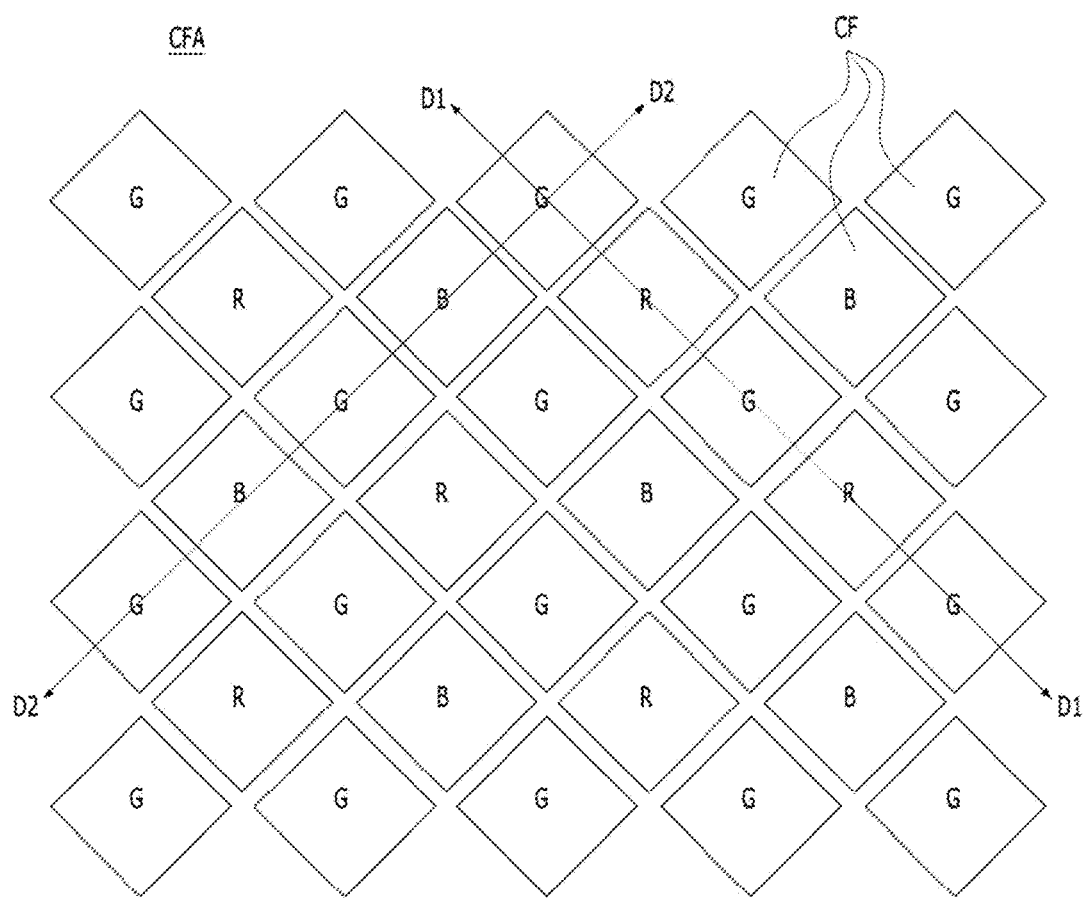
FIG. 4A is a layout diagram schematically illustrating a color filter array of an image sensor in accordance with an embodiment.

FIG. 4A is a layout diagram schematically illustrating a color filter array CFA of an image sensor in accordance with an embodiment. Referring to FIG. 4A, the color filter array CFA of the image sensor in accordance with the embodiment may include a plurality of diamond-shaped color filters G, R, and B which are two-dimensionally arranged. For example, square-shaped color filters CF_G, CF_B, and CF_R tilted at 45 degrees may be repetitively arranged along two diagonal directions D1 and D2 perpendicular to each other. Along the diagonal directions D1 and D2, the green filters G and the red filters R may be alternately arranged or the green filters G and the blue filters B may be alternately arranged.

Further referring to FIGS. 2A and 2B, each of the color filters G, R, and G may cover one of the unit pixels Px, respectively. Specifically, each of the color filters G, R, and B of the color filter array CFA illustrated in FIG. 2D may cover one of the photodiode pairs PDa or PDb, respectively, but each of the color filters G, R, and B of the color filter array CFA illustrated in FIG. 4A may cover one of the unit pixels Px, respectively.

Figure 4B:
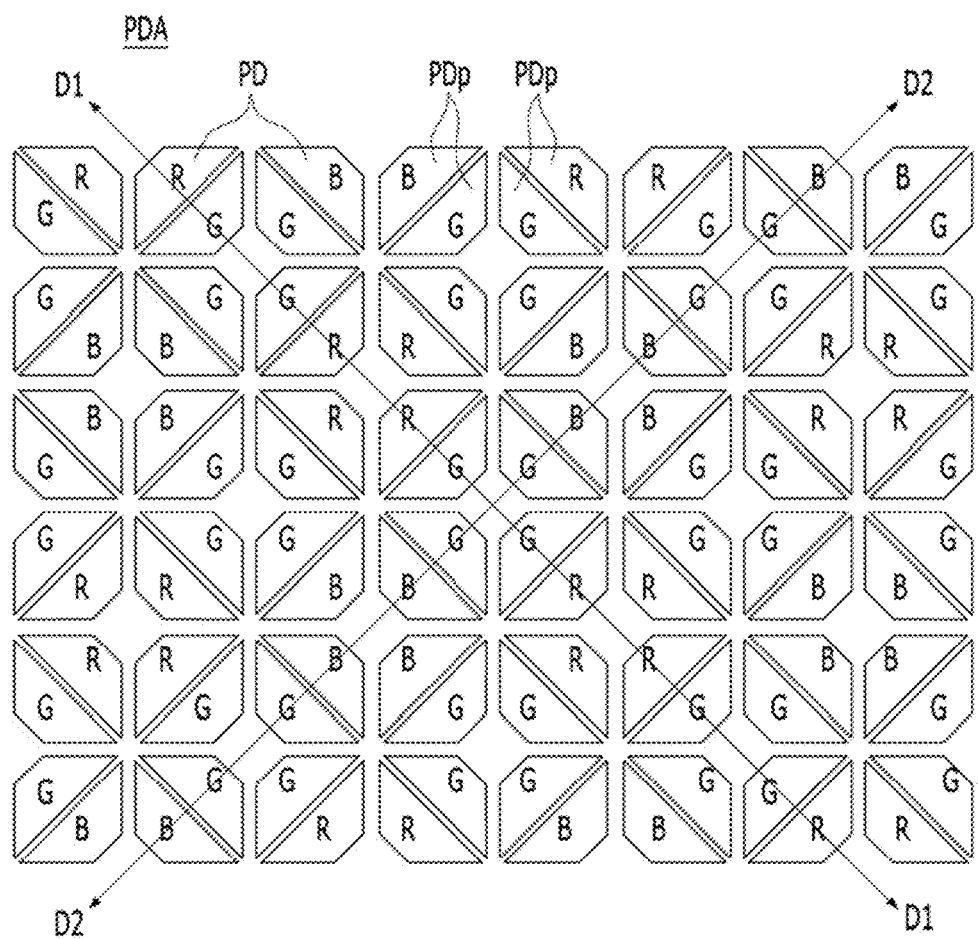
FIG. 4B is a diagram illustrating colors of a photodiode array of an image sensor in accordance with an embodiment.

FIG. 4B is a diagram illustrating the colors G, R, and B of photodiodes of a photodiode array PDA of the image sensor in accordance with the embodiment. Specifically, FIG. 4B illustrates the colors G, R, and B of the photodiodes PD, which are obtained by overlapping the color filter array CFA and the photodiode array PDA. Referring to FIGS. 4A and 4B, each of the photodiodes PD may detect the same color as the color G, R or B of the color filter array CFA overlapping the photodiode PD. Further referring to FIG. 2B, the four photodiodes PD1 to PD4 sharing one floating diffusion region FD in one unit pixel Px may have the same color.

Figure 4C:
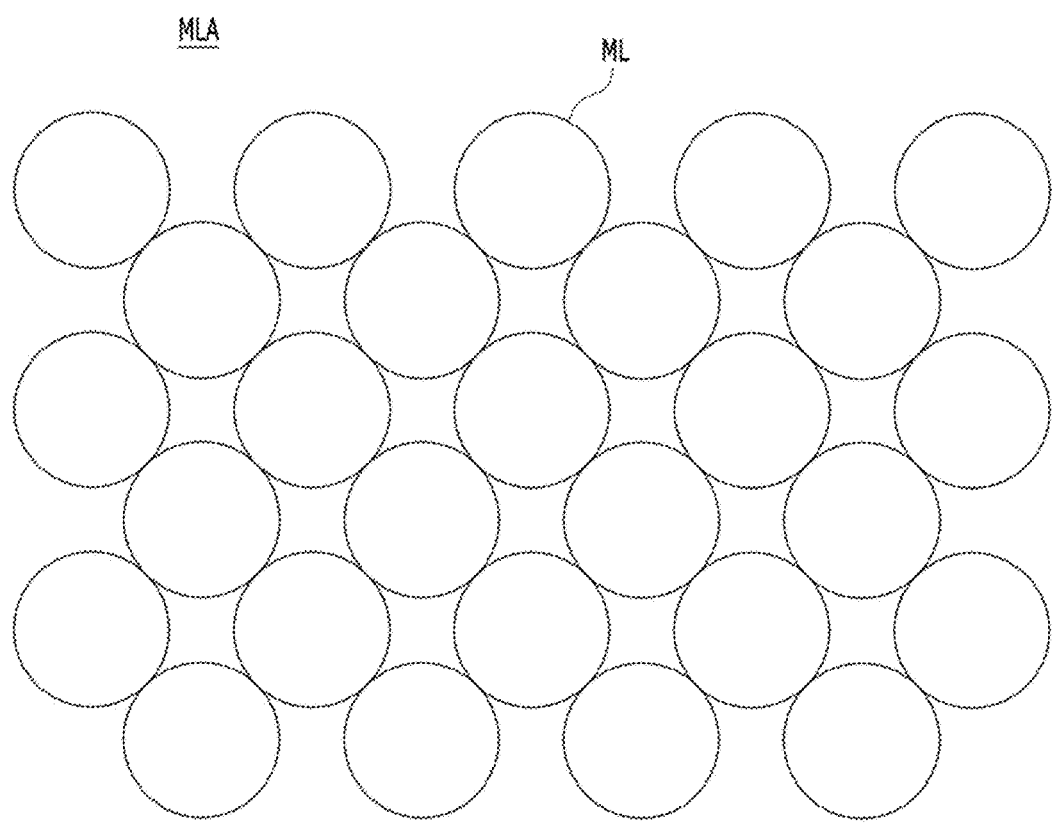
FIG. 4C is a layout diagram schematically illustrating a micro-lens array of an image sensor in accordance with an embodiment.

FIG. 4C is a layout diagram schematically illustrating a micro-lens array MLA of the image sensor in accordance with the embodiment. Referring to FIG. 4C, the micro-lens array MLA of the image sensor in accordance with the embodiment may have the same two-dimensional arrangement as the color filter array CFA described with reference to FIG. 4A. That is, one micro-lens ML may overlap one color filter CF. Thus, referring to FIG. 4B, four separated photodiodes PD in one of the unit pixels Px ray overlap and share one color filter CF and one micro-lens ML.

Figure 4D:
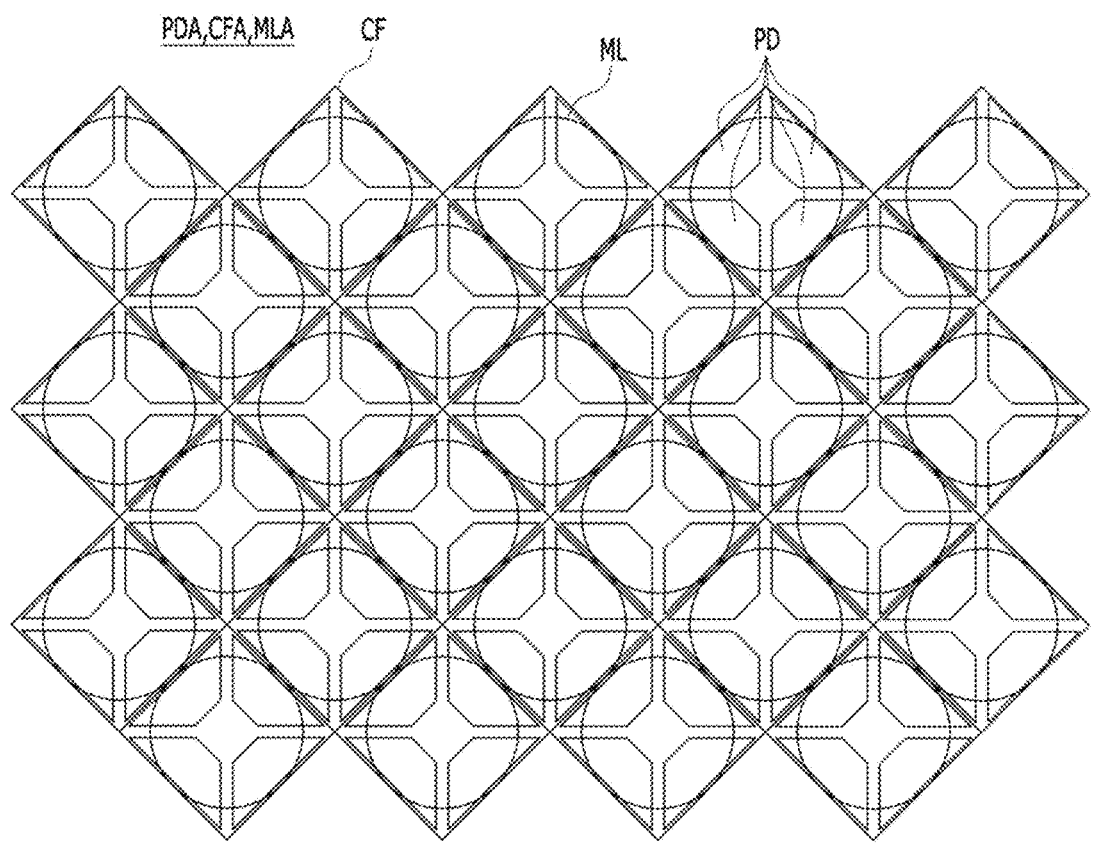
FIG. 4D is a layout diagram obtained by overlapping the photodiode array, the color filter array, and the micro-lens array of an image sensor in accordance with an embodiment.

FIG. 4D is a layout diagram obtained by overlapping the photodiode array PDA, the color filter array CFA, and the micro-lens array MLA of the image sensor in accordance with the embodiment. Referring to FIG. 4D, a unit pixel Px of the image sensor in accordance with an embodiment may include one photodiode of each of the photodiode pairs PDp, one color filter CF, and one micro-lens ML.

Figure 5A:
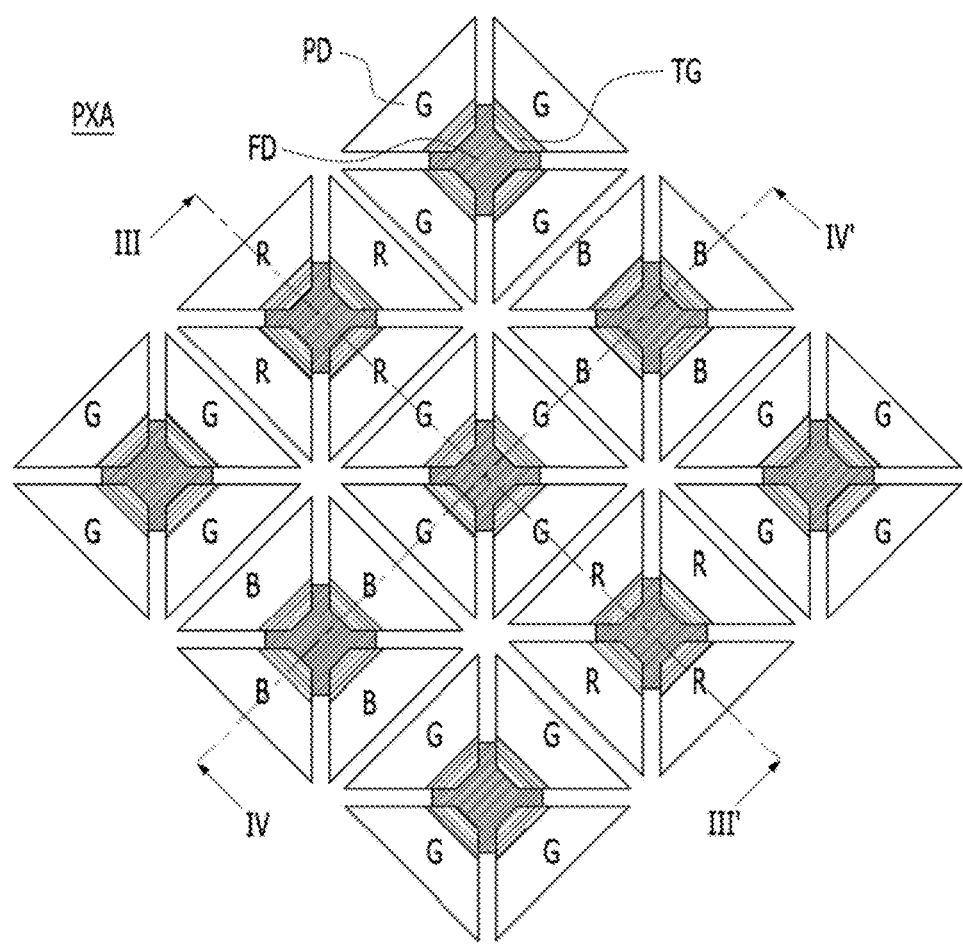
FIG. 5A is a layout diagram schematically illustrating a pixel array of an image sensor in accordance with an embodiment.
Figure 5B:
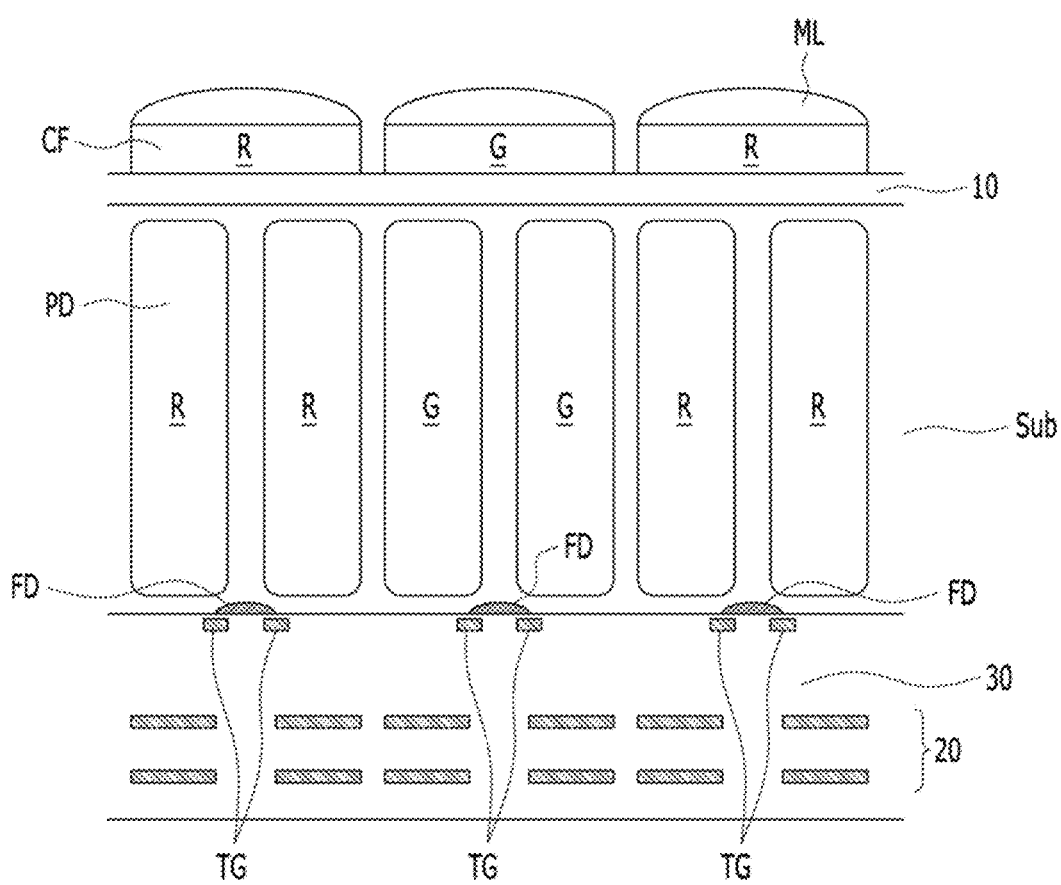
FIGS. 5B and 5C are schematic cross-sectional views taken along the lines III-III' and IV-IV' of FIG. 5A, respectively.
Figure 5C:
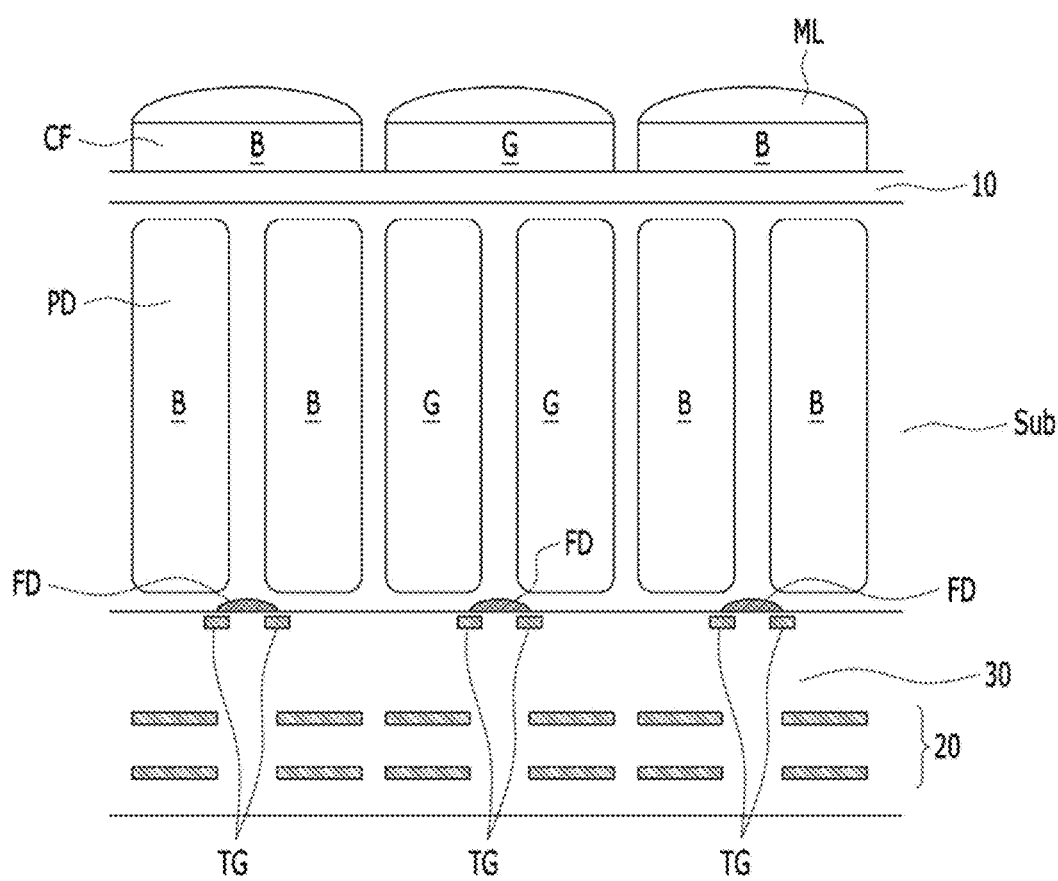

FIG. 5A is a layout diagram schematically illustrating a pixel array PXA of an image sensor in accordance with an embodiment, and FIGS. 5B and 5C are schematic cross-sectional views taken along the lines III-III' and IV-IV' of FIG. 5A, respectively. Referring to FIGS. 5A and 5B, one floating diffusion region FD may be surrounded by four photodiodes PD having the same color. Thus, the floating diffusion regions FD may receive charges from photodiodes PD having the same color through transfer gates TG. That is, one floating diffusion region FD may receive charges from four photodiodes PD, and the four photodiodes PD may have the same color.

The image sensor in accordance with the embodiment may selectively turn on four transfer gates TG, analyze and compare an appropriate amount of charges, and detect a phase difference of light between the four photodiodes PD. That is, although the intensity of light is low, the image sensor can finely detect a phase difference of light.

Figure 6A:
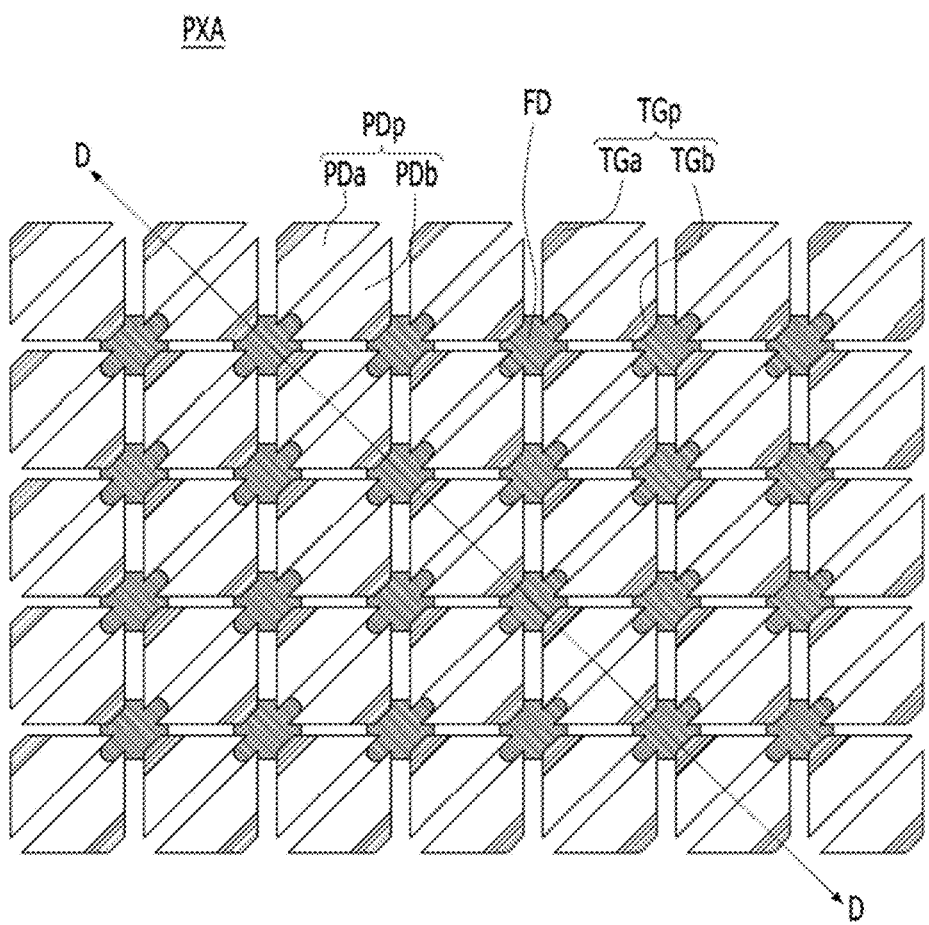
FIG. 6A is a layout diagram schematically illustrating a pixel array of an image sensor in accordance with an embodiment.

FIG. 6A is a layout diagram schematically illustrating a pixel array PXA of an image sensor in accordance with an embodiment. Referring to FIG. 6A, the pixel array PXA of the image sensor in accordance with the embodiment may include photodiode pairs PDp, transfer gate pairs TGa and TGb and floating diffusion regions FD which are two-dimensionally arranged along a diagonal direction D1. Referring to FIG. 2D the photodiode pair PDp may share one color filter. The first photodiode PDa may overlap the left-top portion of one color filter, and the second photodiode PDb may overlap the right-bottom portion of the color filter.

The first photodiode PDa may detect the phase of incident light in the left-half and upper-half parts, and the second photodiode PDb may detect the phase of incident light in the right-half and lower-half parts. That is, a phase difference of light between the horizontal direction and the vertical direction can be detected only through one photodiode pair PDp. The photodiode pair PDp may partially overlap two floating diffusion regions FD. For example, the first and second photodiodes PDa and PDb may be connected to different floating diffusion regions FD from each other. Thus, the first transfer gate TGa for transmitting charge of the first photodiode PDa and the second transfer gate TGb for transmitting charge of the second photodiode PDb may exclusively use different floating diffusion regions FD from each other. Specifically, the first transfer gate TGa at the left top may transmit charge generated in the first photodiode PDa to the floating diffusion region FD at the left top, and the second transfer gate TGb at the right bottom may transmit charge generated in the second photodiode PDb to the floating diffusion region FD at the right bottom.

Figure 6B:
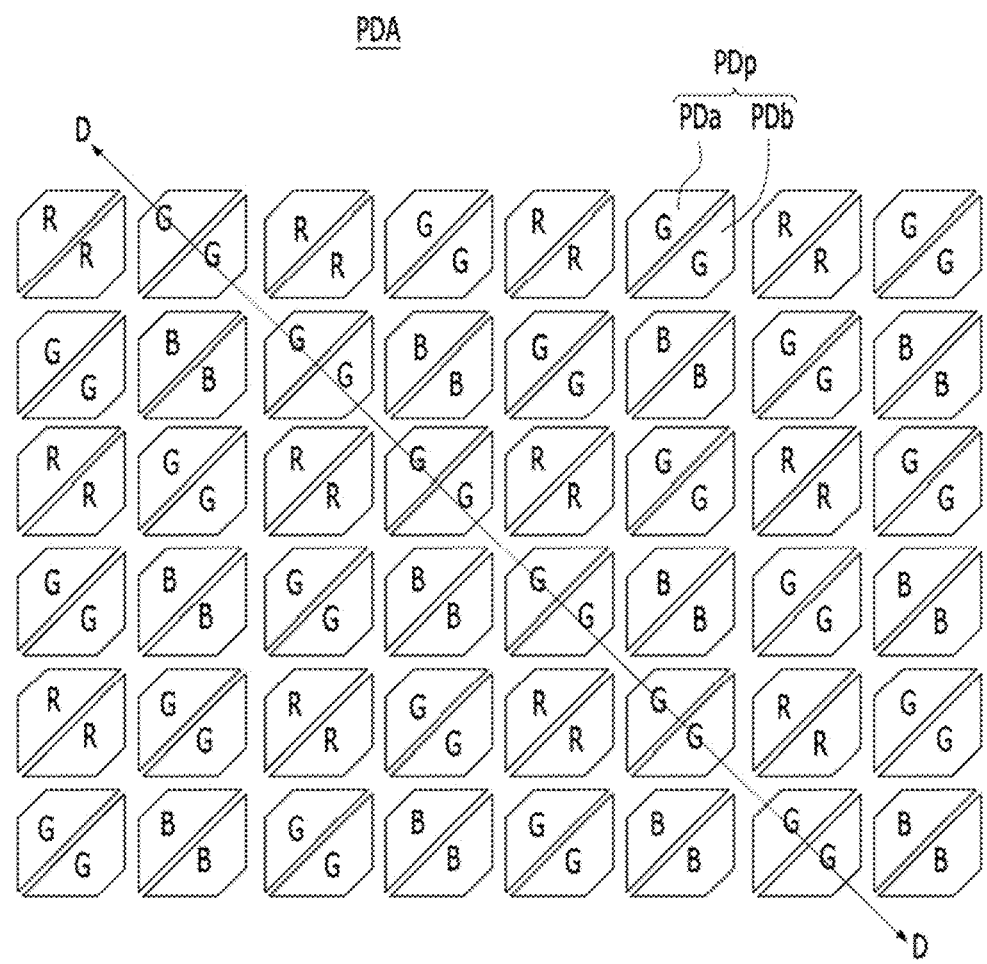
FIG. 6B is a layout diagram schematically illustrating a photodiode array of an image sensor in accordance with an embodiment.

FIG. 6B is a layout diagram schematically illustrating a photodiode array PDA of the image sensor in accordance with the embodiment. Referring to FIG. 6B, the photodiode array PDA of the image sensor in accordance with the embodiment may include a plurality of unit photodiode pairs PDp which are repetitively arranged along one diagonal direction D. Each of the unit photodiode pairs PDp may include first and second photodiodes PDa and PDb which are formed in an isosceles trapezoid shape such that the bottom sides thereof are opposite to each other. Each of the unit photodiode pairs PDp may have a square shape. Each of the first and second photodiodes PDa and PDb may have a shape formed by separating one unit photodiode pair PDp into two parts along the diagonal direction D. The first and second photodiodes PDa and PDb may have a triangle shape. Since the first and second photodiodes PDa and PDb share one color filter, the first and second photodiodes PDa and PDb may have the same color.

Figure 6C:
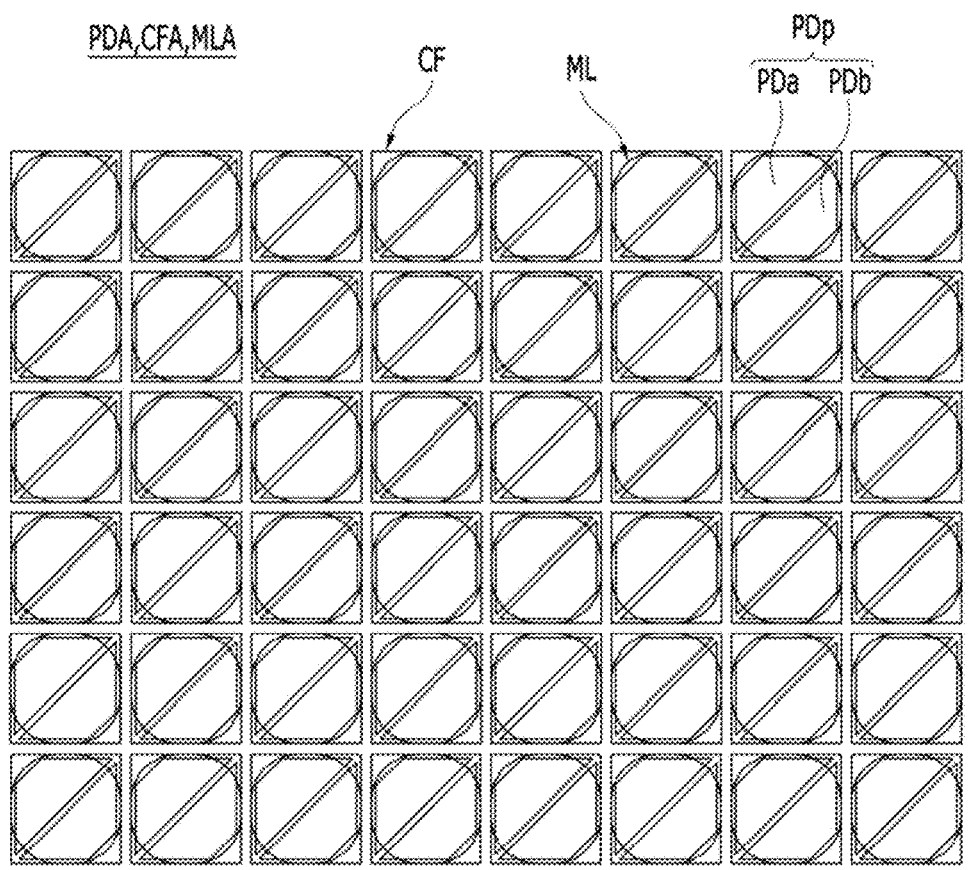
FIG. 6C is a layout diagram obtained by overlapping the photodiode array, the color filter array, and the micro-lens array of an image sensor in accordance with an embodiment.

FIG. 6C is a layout diagram obtained by overlapping the photodiode array PDA, the color filter array CFA, and the micro-lens array MLA of the image sensor in accordance with the embodiment. Referring to FIG. 6C, one photodiode pair PDp having two unit photodiodes PDa and PDb, and one color filter CF overlaps one micro-lens ML.

Figure 7A:
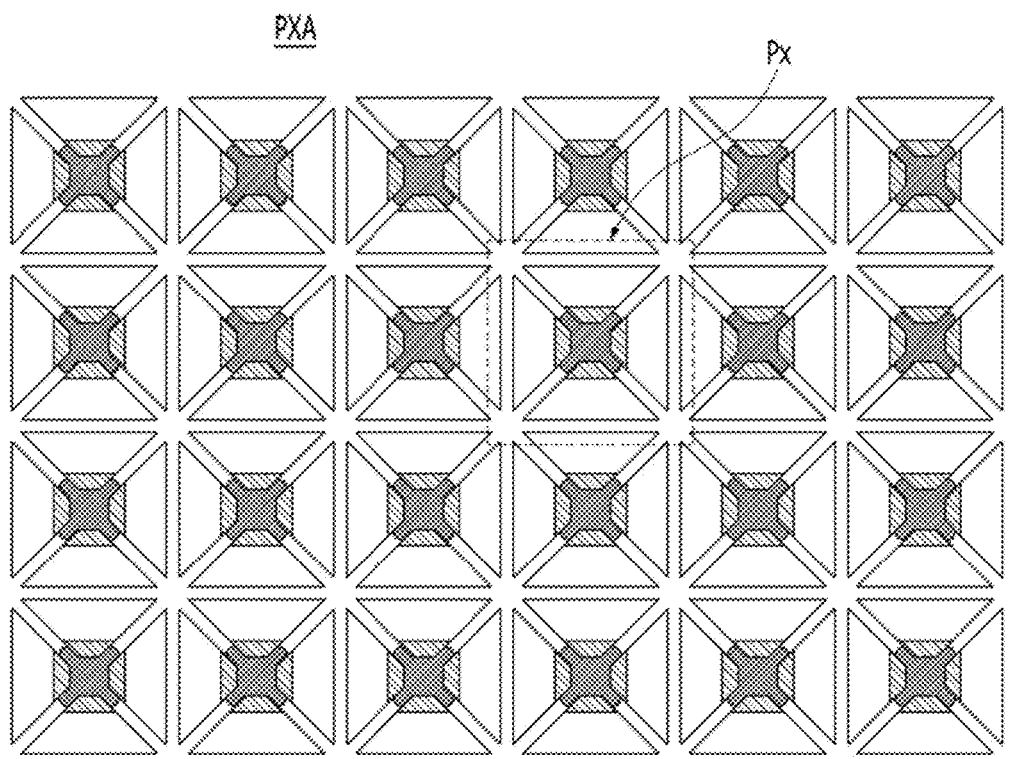
FIG. 7A is a layout diagram schematically illustrating a pixel array of an image sensor in accordance with an embodiment.
Figure 7B:
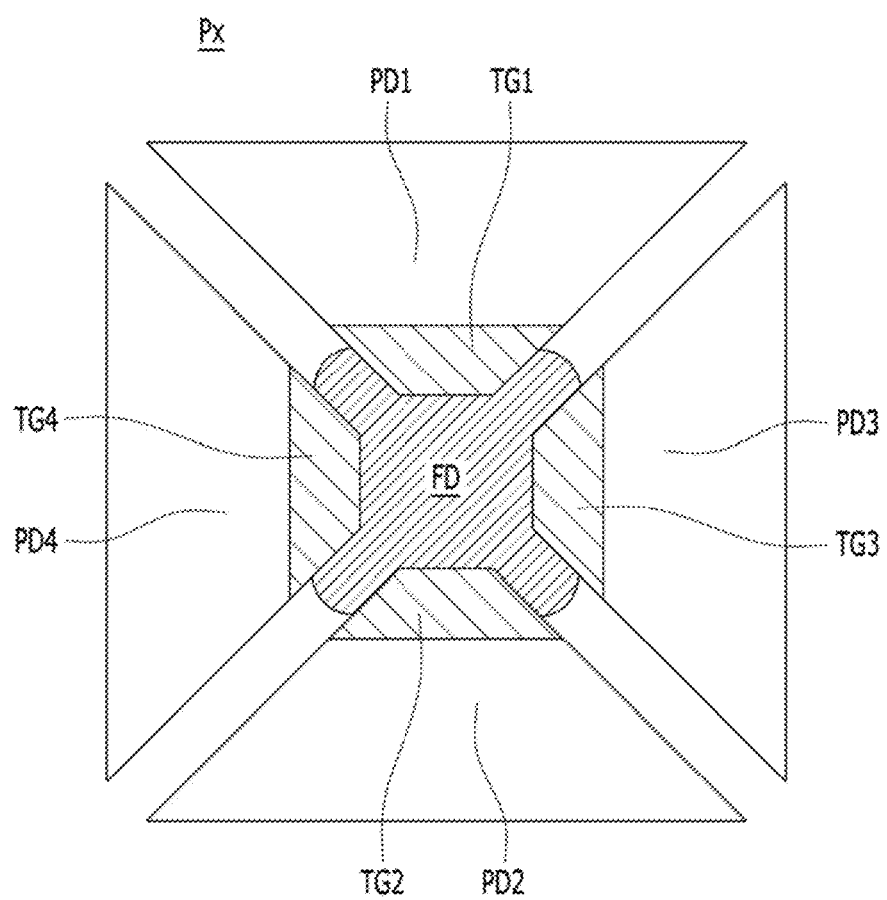
FIG. 7B is an enlarged view of a unit pixel of FIG. 7A.

FIG. 7A is a layout diagram schematically illustrating a pixel array PXA of an image sensor in accordance with an embodiment, and FIG. 7B is an enlarged view of a unit pixel Px of FIG. 7A. Referring to FIGS. 7A and 7B, the pixel array PXA of the image sensor in accordance with the embodiment may include a plurality of rectangular unit pixels Px which are two-dimensionally arranged. For example square-shaped unit pixels Px may be repetitively arranged along a vertical line and a horizontal line which are perpendicular to each other.

Referring to FIG. 7B, one unit pixel Px may include first to fourth photodiodes PD1 to PD4, and first to fourth transfer gates TG1 to TG4, which are two-dimensionally arranged at the top, bottom, right, and left sides of one floating diffusion region FD disposed in the center. The floating diffusion region FD may have a polygon shape such as a square or a circular shape. The first to fourth photodiodes PD1 to PD4, and the first to fourth transfer gates TG1 to TG4 may have an isosceles trapezoid shape or a right-angled triangle shape or isosceles triangle shape. For example, the first to fourth photodiodes PD1 to PD4 may have bottom sides parallel to the horizontal or vertical line, and lateral sides parallel to diagonal lines extending at ±45 degrees with respect to the horizontal line and the vertical line. The short side of the isosceles trapezoid or the vertex of the triangle may face the floating diffusion region FD. The first to fourth transfer gates TG1 to TG4 may overlap parts of the photodiodes PD1 to PD4 and parts of the floating diffusion region FD, respectively.

Figure 7C:
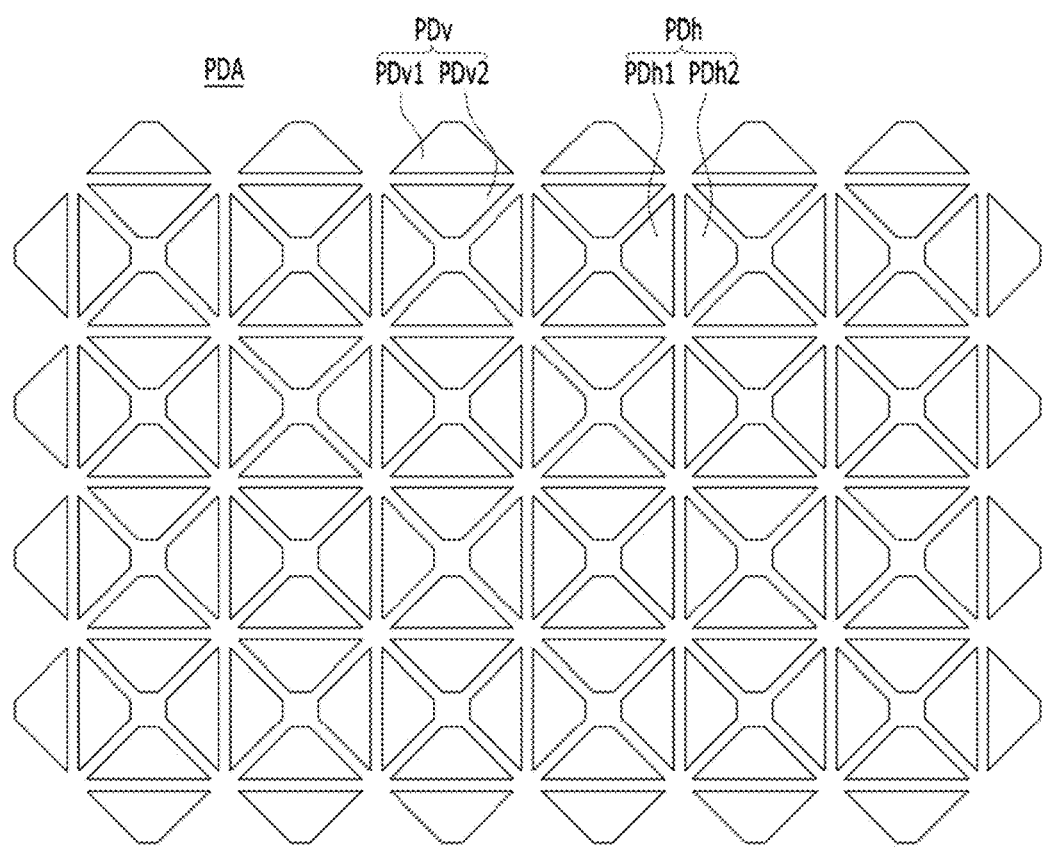
FIG. 7C is a layout diagram schematically illustrating a photodiode array of an image sensor in accordance with an embodiment.

FIG. 7C is a layout diagram schematically illustrating a photodiode array PDA of the image sensor in accordance with the embodiment. Referring to FIG. 7C, the photodiode array PDA of the image sensor in accordance with the embodiment may include a plurality of diamond-shaped unit photodiode pairs PDv and PDh which are repetitively arranged along a horizontal or vertical line. The unit photodiode pair PDv or PDh may include two unit photodiodes PDv1 and PDv2, or PDh1 and PDh2 which are formed in an isosceles trapezoid shape such that the bottom sides thereof are opposite to each other. Each of the unit photodiodes PDv1, PDv2, PDh1, and PDh2 may have a shape formed by dividing one unit photodiode pair PDv or PDh into two parts along the horizontal or vertical line.

Figure 7D:
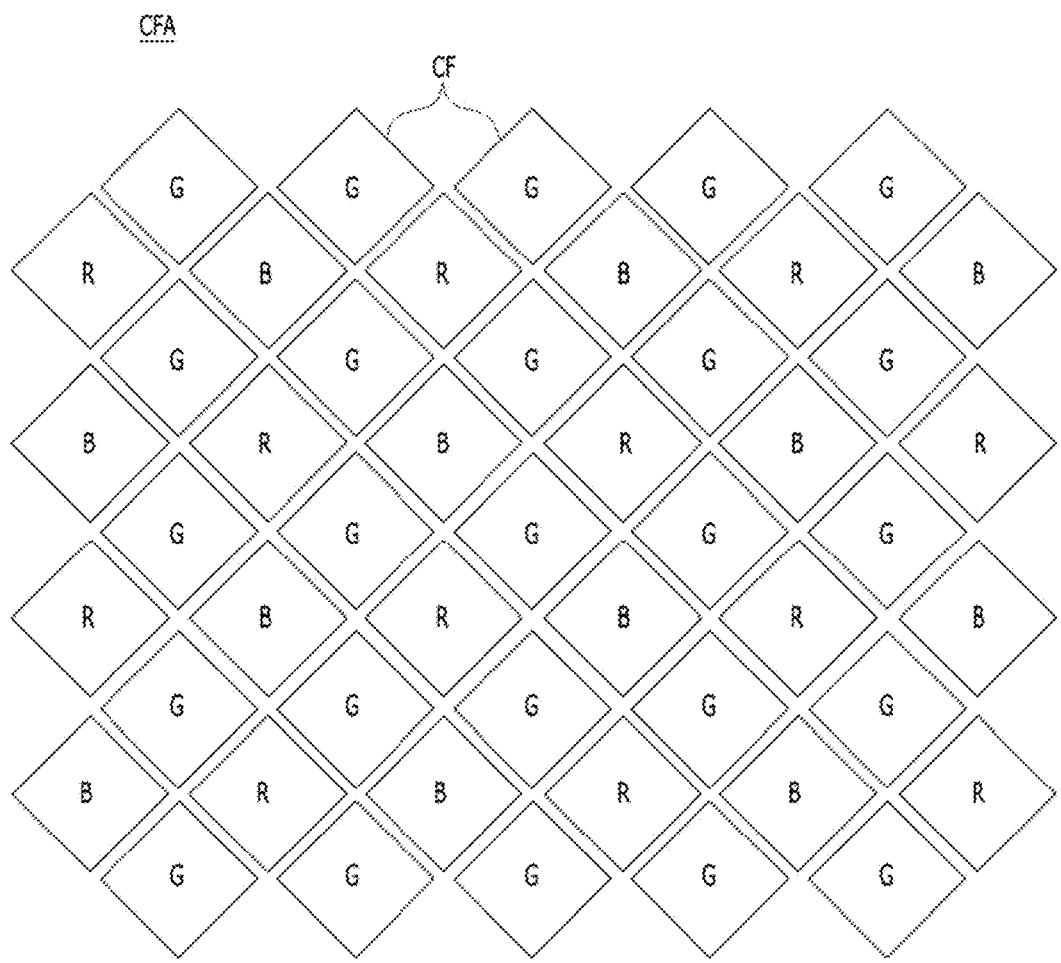
FIG. 7D is a layout diagram schematically illustrating a color filter array of an image sensor in accordance with an embodiment.

FIG. 7D is layout diagram schematically illustrating a color filter array CFA of the image sensor in accordance with the embodiment. Referring to FIG. 7D the color filter array CFA of the image sensor in accordance with the embodiment may include diamond-shaped color filters CF arranged along diagonal directions corresponding to ±45 degrees, for example, green filters G, blue filters B, and red filters R. For example, the green filters G may be consecutively arranged along the horizontal line and the vertical line, and the blue filters B and the red filters R may be alternately arranged along the horizontal line and the vertical line. The blue filters B and the red filters R may be alternately arranged in the vertical or horizontal direction. Along the diagonal directions, the green filters G and the blue filters B may be alternately arranged, and the green filters G and the red filters may be alternately arranged. That is, along the diagonal direction, a pair of the green filter G and the blue filter B, or a pair of the green filter G and the red filter R may be consecutively arranged. Alternatively, the green filters G, the blue filters B, and the red filters R may be arranged in a zigzag shape along the vertical or horizontal direction.

Figure 7E:
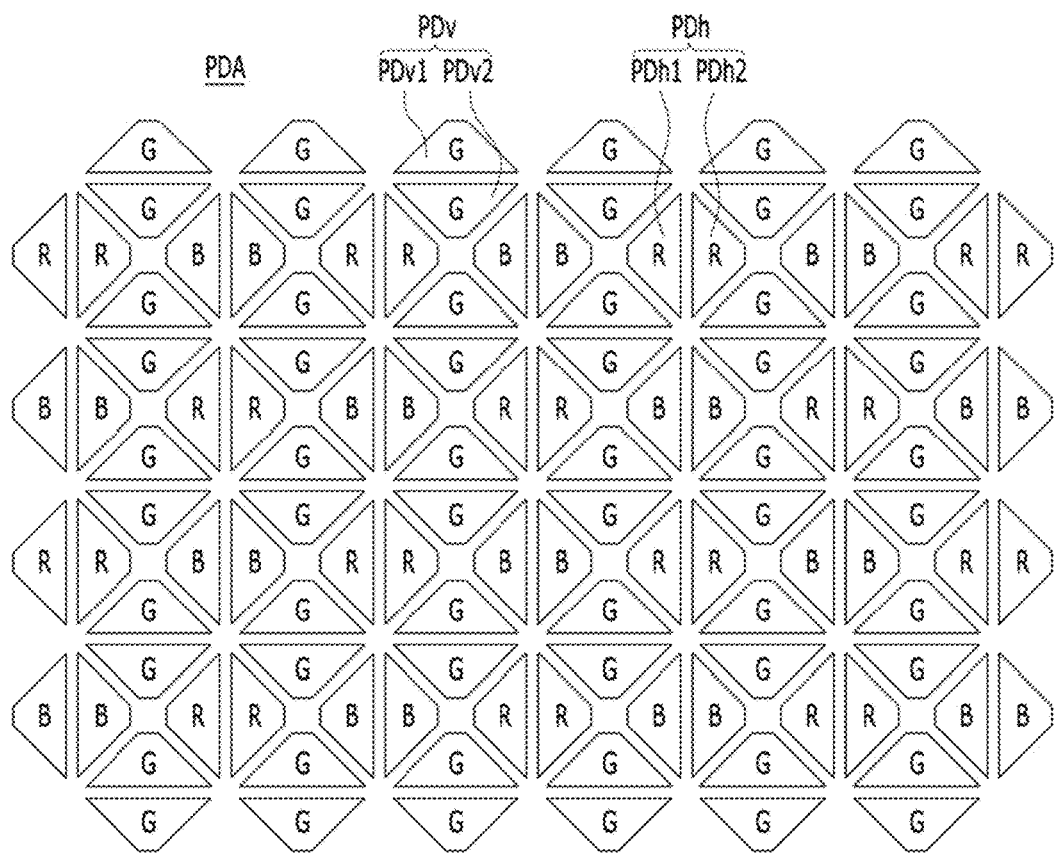
FIG. 7E is a diagram illustrating the colors of the photodiode array of an image sensor in accordance with an embodiment.

FIG. 7E is a diagram illustrating the colors G, B, and R of the photodiodes of the photodiode array PDA of the image sensor in accordance with the embodiment. Specifically, FIG. 7E illustrates the colors of the photodiodes PD, which are obtained by overlapping the color filter array CFA and the photodiode array PDA. Referring to FIG. 7E, each of the photodiodes PD may have the same color according to the color filter array CFA overlapping the photodiode PD. Referring to FIGS. 7C and 7D, each of the unit photodiode pairs PDv and PDh, including the photodiodes of which the bottom sides are opposite to each other, may overlap one color filter CF.

Figure 7F:
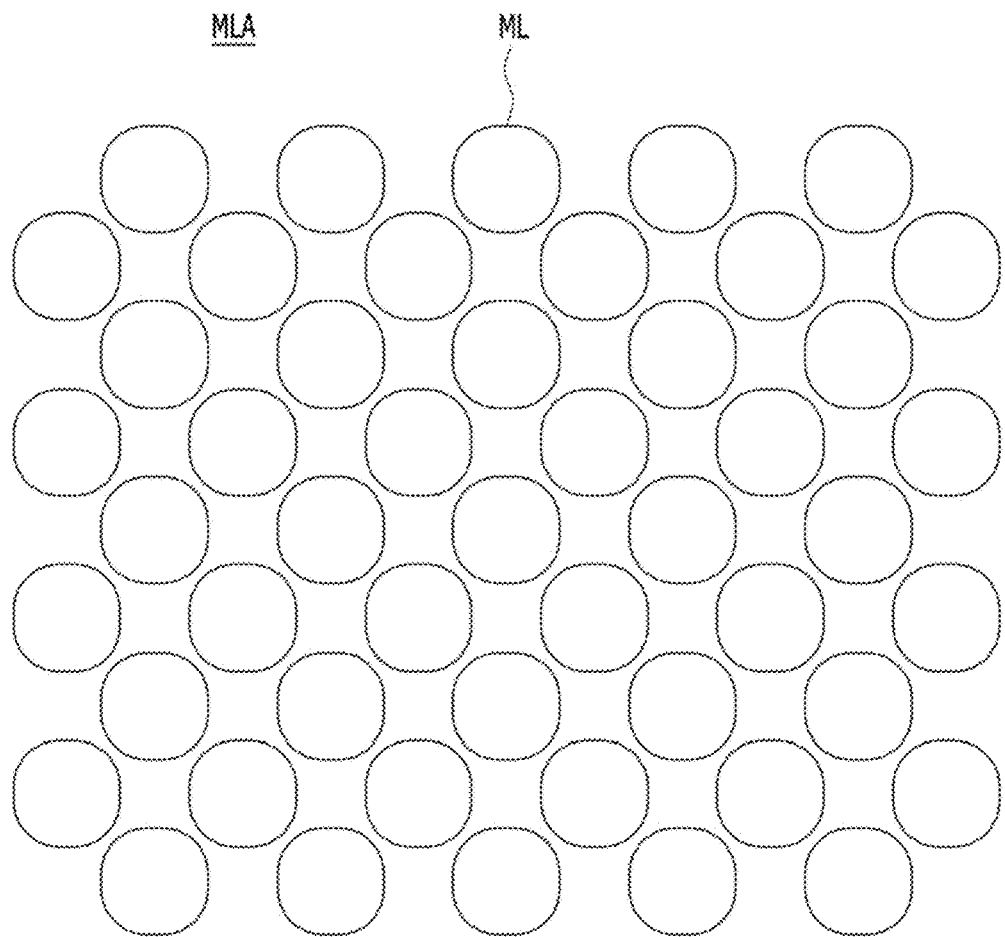
FIG. 7F is a layout diagram schematically illustrating a micro-lens array of an image sensor in accordance with an embodiment.

FIG. 7F is a layout diagram schematically illustrating a micro-lens array MLA of the image sensor in accordance with the embodiment. Referring to FIG. 7F, the micro-lens array MLA of the image sensor in accordance with the embodiment may have a two-dimensional arrangement which vertically overlaps the color filter array CFA described with reference to FIG. 7D. That is, one micro-lens ML may overlap one color filter CF. Thus, referring to FIG. 7E, one unit photodiode pair PDv or PDh may overlap and share one micro-lens ML.

Figure 8:
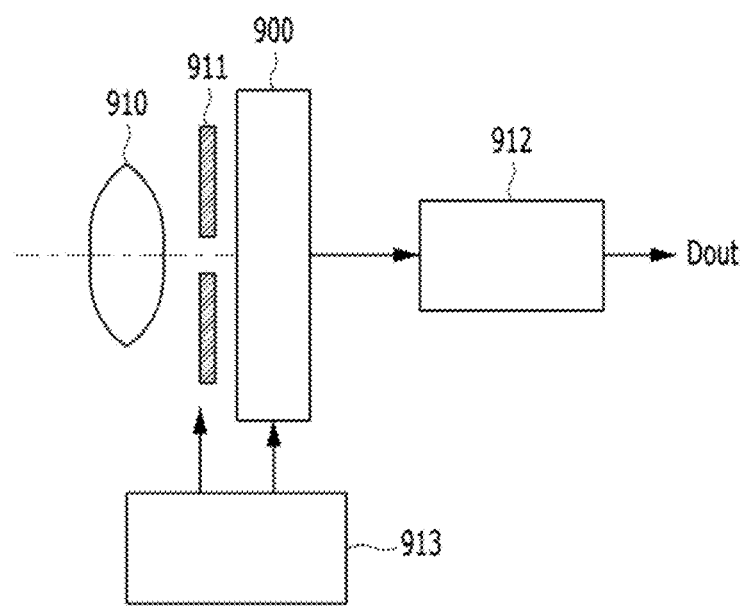
FIG. 8 is a diagram schematically illustrating an electronic device including an image sensor with a pixel array PXA in accordance with an embodiment.

FIG. 8 is a diagram schematically illustrating an electronic device including one or more of the image sensors with a pixel array PXA in accordance with the various embodiments. Referring to FIG. 8 the electronic device including one or more of the image sensors with a pixel array PXA in accordance with the various embodiments may include a camera capable of taking a still image or moving image. The electronic device may include an optical system or optical lens 910, a shutter unit 911, an image sensor 900, a driving unit 913 for controlling/driving the shutter unit 911, and a signal processing unit 912.

The optical system 910 may guide image light that is, incident light from an object to the pixel array 100 (refer to FIG. 1) of the image sensor 900. The optical system 910 may include a plurality of optical lenses. The shutter unit 911 may control a light irradiation period and a light shielding period for the image sensor 900. The driving unit 913 may control a transfer operation of the image sensor 900 and a shutter operation of the shutter unit 911. The signal processing unit 912 may perform various types of signal processes on signals outputted from the image sensor 900. The processed image signals Dout may be stored in a storage medium such as a memory or outputted to a monitor or the like.

In accordance with the various embodiments, since the image sensors have the photodiodes separated in diagonal directions, the image sensors can efficiently sense a phase difference of light. For example, a phase difference of light in the vertical direction and a phase difference of light in the horizontal direction may be sensed by one unit pixel.

Furthermore, since all pixels and photodiodes in the image sensors can sense a phase difference of light, the operating speed and accuracy of the image sensors and the auto-focus function of the camera can be improved.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
 a first floating diffusion region, and first, second, third, and fourth photodiodes, which in combination form a first unit pixel;
 a second floating diffusion region, and fifth, sixth, seventh, and eighth photodiodes, which in combination form a second unit pixel,
 wherein the first, the second, the third, and the fourth photodiodes surround and share the first floating diffusion region,
 wherein the fifth, the sixth, the seventh, and the eighth photodiodes surround and share the second floating diffusion region,
 wherein the first, the third, the fifth, and the seventh photodiodes are arranged in a first direction,
 wherein the first and the seventh photodiodes are located next to each other in the first direction,
 wherein the second and the fourth photodiodes are arranged in a second direction which is perpendicular to the first direction,
 wherein the sixth and the eighth photodiodes are arranged in a third direction which is perpendicular to the first direction and is parallel to the second direction, and
 wherein the first floating diffusion region and the second floating diffusion region are arranged in the first direction.

2. The image sensor of claim 1, further comprising:
 a first color filter overlapping and shared by the first and the seventh photodiodes; and
 a first micro-lens overlapping the first color filter.

3. The image sensor of claim 2,
 wherein the first color filter has a first size,
 wherein each of the first through eighth photodiodes has a second size, and
 wherein the second size is a half of the first size.

4. The image sensor of claim 1, further comprising:
 first, second, third, and fourth transfer gates coupled between the first floating diffusion region and the first, the second, the third, and the fourth photodiodes, respectively, and
 fifth, sixth, seventh, and eighth transfer gates coupled between the second floating diffusion region and the fifth the sixth, the seventh, and the eighth photodiodes, respectively.

5. The image sensor of claim 1, further comprising:
 a first color filter overlapping the first, the second, the third, and the fourth photodiodes, and
 a second color filter overlapping the overlapping the fifth, the sixth, the seventh, and the eighth photodiodes.

6. The image sensor of claim 5, further comprising:
a first micro-lens overlapping the first color filter; and
a second micro-lens overlapping the second color filter.

7. An image sensor comprising:
first to eighth photodiodes;
a color filter overlapping and shared by two or more of the first to eighth photodiodes; and
a micro-lens overlapping the color filter,
wherein the first and the fifth photodiodes are located next to each other, are symmetrical in shape to each other, and, in combination, form a rectangular shape,
wherein the second and the sixth photodiodes are located next to each other, are symmetrical in shape to each other, and, in combination, form a rectangular shape,
wherein the third and the seventh photodiodes are located next to each other, are symmetrical in shape to each other, and, in combination, form a rectangular shape, and
wherein the fourth and the eighth photodiodes are located next to each other, are symmetrical in shape to each other, and, in combination, form a rectangular shape.

8. The image sensor of claim 7, wherein each of the first to eighth photodiodes is fanned in a trapezoid or a triangle shape.

9. The image sensor of claim 8,
wherein the color filter includes first, second, third, and fourth color filters,
wherein the first color filter overlaps and is shared by the first and the fifth photodiodes,
wherein the second color filter overlaps and is shared by the second and the sixth photodiodes,
wherein the third color filter overlaps and is shared by the third and the seventh photodiodes, and
wherein the fourth color filter overlaps and is shared by the fourth and the eighth photodiodes.

10. The image sensor of claim of claim 9,
wherein the micro-lens includes first, second, third, and fourth micro-lenses,
wherein the first micro-lens overlaps the first color filter,
wherein the second micro-lens overlaps the second color filter,
wherein the third micro-lens overlaps the third color filter, and
wherein the fourth micro-lens overlaps the fourth color filter.

11. The image sensor of claim 10, further comprising:
a first floating region, and
wherein the first, the second, the third, and the fourth photodiodes are arranged to surround the first floating region,
wherein the first, the second, the third, and the fourth color filters are arranged to surround the first floating region, and
wherein the first, the second, the third, and the fourth micro-lenses are arranged to surround the first floating region.

12. The image sensor of claim 10, further comprising:
a first transfer gate coupled between the first floating region and the first photodiode;
a second transfer gate coupled between the first floating region and the second photodiode;
a third transfer gate coupled between the first floating region and the third photodiode; and
a fourth transfer gate coupled between the first floating region and the fourth photodiode,
wherein (i) the first floating region, (ii) the first, the second, the third, and the fourth photodiodes, and (iii) the first, the second, the third, and the fourth transfer gates, in combination, form a unit pixel.

13. The image sensor of claim 8,
wherein the color filter includes first, second, third, fourth, and fifth color filters,
wherein the first color filter overlaps and is shared by the first, the second, the third, and the fourth photodiodes,
wherein the second color filter overlaps the fifth photodiode,
wherein the third color filter overlaps the sixth photodiode,
wherein the fourth color filter overlaps the seventh photodiode, and
wherein the fifth color filter overlaps the eighth photodiode.

14. The image sensor of claim of claim 13,
wherein the micro-lens includes first, fifth, sixth, seventh, and eighth micro-lenses,
wherein the first micro-lens overlaps the first color filter,
wherein the fifth micro-lens overlaps the fifth color filter,
wherein the sixth micro-lens overlaps the sixth color filter,
wherein the seventh micro-lens overlaps the seventh color filter, and
wherein the eighth micro-lens overlaps the eighth color filter.

15. The image sensor of claim 7, further comprising:
a first floating diffusion region coupled to the first photodiode and further coupled to one or more of the second, the third, and the fourth photodiodes; and
a second floating diffusion region coupled to the fifth photodiode.

16. An image sensor comprising:
first and second photodiodes,
a first color filter shared by the first and the second photodiodes, and
first and second floating diffusion regions coupled to the first and the second photodiodes, respectively, and
a micro-lens overlapping the first color filter.

17. The image sensor of claim 16, further comprising:
third, fourth, and fifth photodiodes,
wherein the first, the third, the fourth, and the fifth photodiodes surround and are coupled to the first floating diffusion region, and
wherein (i) the first, the third, the fourth, and the fifth photodiodes and (ii) the first floating diffusion region, in combination, form a first unit pixel.

18. The image sensor of claim 17, further comprising:
sixth; seventh, and eighth photodiodes;
third, fourth, and fifth floating diffusion regions coupled to the sixth, the seventh, and the eighth photodiodes, respectively;
a second color filter shared by the third and the sixth photodiodes;
a third color filter shared by the fourth and the seventh photodiodes; and
a fourth color filter shared by the fifth and the eighth photodiodes,
wherein (i) a half of the first color filter, (ii) a half of the second color filter, (iii) a half of the third color filter, (iv) a half of the fourth color filter, and (vi) the first floating diffusion region, in combination, form the first unit pixel.

19. The image sensor of claim 16, further comprising:
a first transfer gate coupled between the first photodiode and the first floating diffusion region; and
a second transfer gate coupled between the second photodiode and the second floating diffusion region.

20. The image sensor of claim 16, wherein the first and second photodiodes are located next to each other, are symmetrical in shape to each other, and, in combination, form a rectangular shape.

* * * * *